(12) United States Patent
Nakai

(10) Patent No.: US 6,385,115 B1
(45) Date of Patent: May 7, 2002

(54) SEMICONDUCTOR MEMORY DEVICE WITH SENSE AMPLIFIER POWER SUPPLY CONFIGURATION CAPABLE OF SUPPLYING STABLE POWER SUPPLY VOLTAGE TO SENSE AMPLIFIERS

(75) Inventor: Jun Nakai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/670,993

(22) Filed: Sep. 26, 2000

(30) Foreign Application Priority Data

Mar. 14, 2000 (JP) ........................................ 2000-069797

(51) Int. Cl.$^7$ ................................................. G11C 7/00
(52) U.S. Cl. ........................................ 365/226; 365/207
(58) Field of Search ................................. 365/226, 207, 365/208, 189.07, 189.09

(56) References Cited

U.S. PATENT DOCUMENTS 5,373,477 A * 12/1994 Sugibayashi ................ 365/226
6,064,621 A    5/2000 Tanizaki et al.
6,104,630 A *  8/2000 Hidaka ........................ 365/63
6,166,977 A * 12/2000 Saitoh ........................ 365/205

* cited by examiner

Primary Examiner—A. Zarabian
(74) Attorney, Agent, or Firm—McDermott, Will & Emery

(57) ABSTRACT

There are provided power supply drivers to respective sense amplifier bands, and each the power source drivers is activated when sense amplifier circuits of a corresponding sense amplifier band operate. A power supply driver supplies a current to a corresponding sense power supply line when activated according to a control voltage from an active sense amplifier power supply/control circuit. Sense amplifier power supply lines and an array power line are laid over on a memory mat in a meshed shape arrangement and subject to current supply when the active sense amplifier power supply/control circuit operates. Reduction in level of a sense amplifier power supply voltage on a sense amplifier power supply line is exactly suppressed independently of a distance from an array power supply voltage generation circuit included in the active sense amplifier power source control circuit.

16 Claims, 15 Drawing Sheets

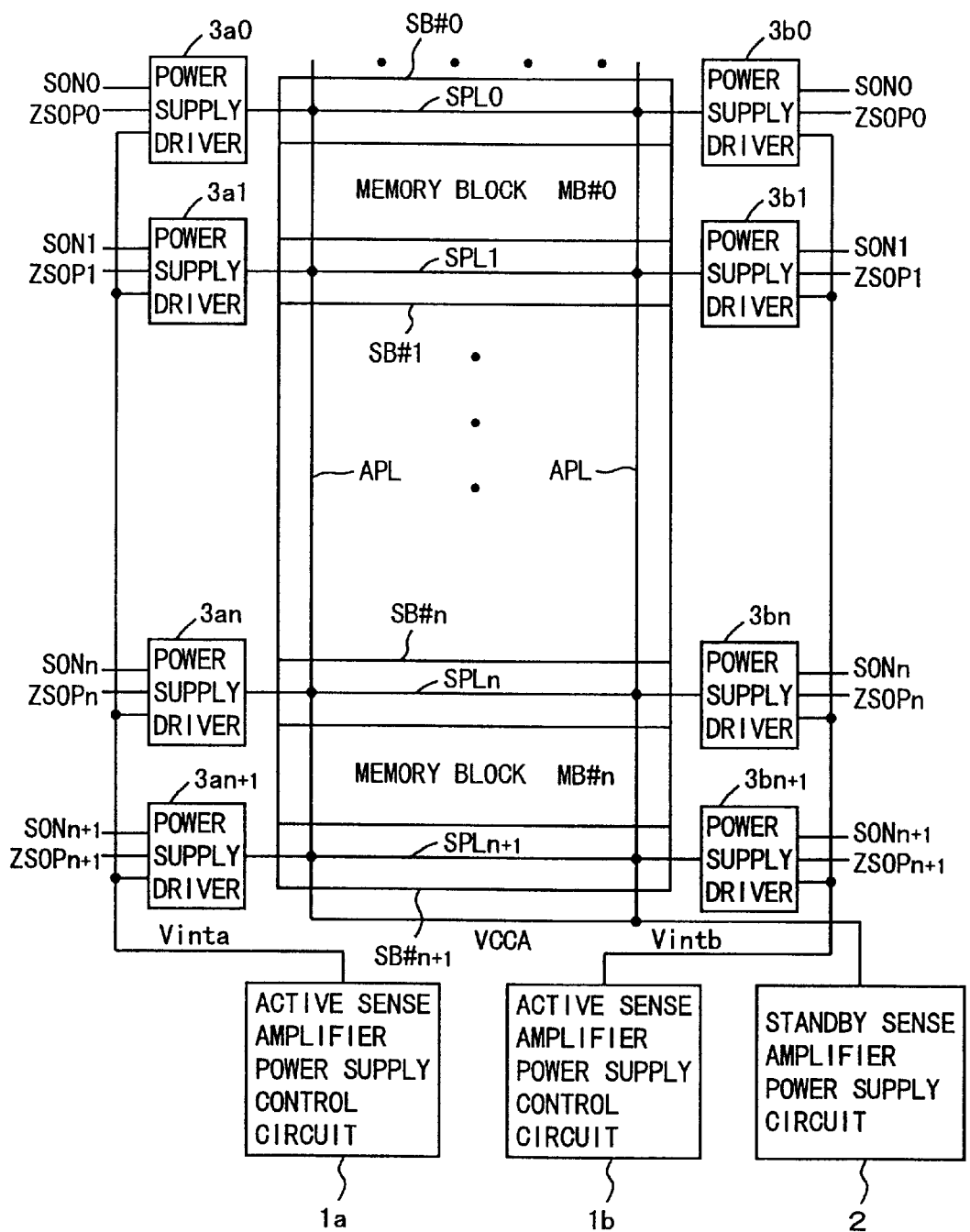
F I G. 1

SEMICONDUCTOR MEMORY DEVICE WITH SENSE AMPLIFIER POWER SUPPLY CONFIGURATION CAPABLE OF SUPPLYING STABLE POWER SUPPLY VOLTAGE TO SENSE AMPLIFIERS

BACKGROUND OF THE INVENTION

1. Field of the Invention

The present invention relates to a semiconductor memory device and particularly, to a power supply configuration for sense amplifier circuits sensing and amplifying a memory cell data.

2. Description of the Background Art

FIG. 23 is a diagram schematically showing a construction of a memory mat of a conventional semiconductor device. In FIG. 23, a memory array is divided into a plurality of memory blocks MB#1 to MB#n each including a plurality of memory cells arranged in rows and columns. Sense amplifier bands SB#1 to SB#n−1 each are arranged between memory blocks adjacent in a column direction and sense amplifier bands SB#0 and SM#n are arranged outside the memory blocks MB#1 and MB#n, respectively. In each sense amplifier band, sense amplifier circuits are arranged corresponding to columns of the adjacent memory blocks and the sense amplifier circuits are shred between the adjacent memory blocks. A memory array is divided into the plurality of memory blocks MB#1 to MB#n and sense amplifier circuits are arranged on both sides of each of the memory blocks MB#1 to MB#n to make shorter lengths of bit line pairs provided in correspondence to respective memory cell columns in each memory block and thereby loads thereon are reduced, so that a memory cell data at a sufficiently high voltage level is transmitted to a sense amplifier circuit at a high speed and a high-speed sense operation is realized.

In such a memory mat configuration, a power supply voltage and a ground voltage are supplied to the sense amplifier bands SB#0 to SB#n in order that sense amplifiers sense and amplify memory cell data on corresponding columns. In a case where the power supply voltage and the ground voltage are transmitted over a long distance, levels of the power supply voltage and the ground voltage varies due to interconnection line resistance of power source voltage supply lines (including a power supply voltage line and a ground voltage line), whereby no correct sense operation can be performed. Further, with the presence of such interconnection line resistance, the power source voltage (power supply voltage and ground voltage) cannot be supplied to sense amplifiers at a high speed (variations of the power supply voltage cannot be suppressed). Therefore, the power supply line and the ground line are laid on the memory cell array in a meshed shape arrangement in order to supply the sense amplifier power supply voltage and the sense amplifier ground voltage in a stable manner to sense amplifier circuits included in the sense amplifier bands SB#0 to SB#n.

FIG. 24 is a block diagram schematically showing a power supply configuration of a conventional semiconductor memory device. In FIG. 24, a main power supply line MPL is laid out so as to surround the memory mat. Subsidiary power supply lines SBPL are laid out so as to be connected to the main power supply line MPL and extends over the memory blocks MB#1 to MB#n, and over the sense amplifier bands SB#0 to SB#n. In each of the sense amplifier bands SB#0 to SB#n, there is laid out a sense amplifier power supply line SAPL in order to transmit the power supply voltage to the sense amplifier circuits. To the main power supply line MPL, active sense amplifier power supply circuits ACVG1 and ACVG2 made active in an active cycle and generating a sense amplifier power supply voltage VCCA are connected and a standby sense amplifier power supply voltage circuit STVG maintaining a level of the power supply voltage VCCA on the main power supply line MPL is also connected. Here, an active cycle indicates an operating cycle in which rows (word lines) in a predetermined number of blocks among the memory blocks MB#1 to MB#n are each driven to a selected state and the corresponding sense amplifier circuits operate. A standby cycle indicates an operating cycle in which all rows (word lines) in the memory blocks MB#1 to MB#n are held in a non-selected state. In the standby cycle, the active sense amplifier power supply circuits ACVG1 and ACVG2 are held in an inactive state.

With the power supply line and the sense amplifier power supply lines SAPL transmitting the sense amplifier power supply voltage VCCA, laid on the memory mat in a meshed shape arrangement, interconnection line resistance of the sense amplifier power supply lines SAPL provided in the respective sense amplifier bands SB#0 to SB#n are reduced equivalently and further a width of interconnection line is also larger equivalently, thereby enabling the power supply voltage VCCA to be supplied in a stable manner.

In FIG. 24, power supply lines transmitting the sense amplifier power supply voltage VCCA are shown and ground lines transmitting the ground voltage VSS are also laid on the memory mat in a meshed shape arrangement.

With the active sense amplifier power supply circuits ACVG1 and ACVG2 provided, currents are supplied onto the main power supply line MPL, the subsidiary power supply lines SBPL and the sense amplifier power supply lines SAPL from both sides of one end of the memory mat in a stable manner to prevent the power supply voltage of the sense amplifier power supply voltage VCCA from being distributed. Further, the active sense amplifier power supply circuits ACVG1 and ACVG2 are activated when the memory mat enters an active cycle and the sense amplifier circuits in a selected sense amplifier band operate to consume the sense amplifier power supply voltage VCCA, with the result that a level down in the sense amplifier power supply voltage VCCA is prevented from occurring. Therefore, the active sense amplifier power supply circuits ACVG1 and ACVG2 each are required to have at least a capability to compensate for a current consumed in the sense amplifier circuits and thus, have a comparatively large current drive capability.

On the other hand, while the standby sense amplifier power supply circuit STVG operates all time, requirement thereon is only to compensate for reduction in the sense amplifier power supply voltage VCCA caused by a leakage current in the standby cycle and a current drive capability of the standby sense amplifier power supply circuit STVG is small comparatively.

FIG. 25 is a circuit diagram showing a configuration of one sense amplifier circuit and its peripheral circuits included in a sense amplifier band. In FIG. 25, the sense amplifier band SB# is shared between the memory blocks MB#L and MB#R. The sense amplifier circuit includes a sense amplifier SA performing differential amplification of potentials on common bit lines CBL and ZCBL when activated and sense amplifier activation transistors P1 and N1 which become conductive when a sense amplifier activation signal ZSOP and SOP are activated, to transmit the sense amplifier power supply voltage VCCA on the sense amplifier power supply line and the sense amplifier ground voltage VSS on the sense amplifier ground line to the sense amplifier SA. A pair of the sense amplifier activation transistors P1 and N1 are provided commonly to a predetermined number of sense amplifiers. A sense amplifier SA includes P channel MOS transistors P2 and P3 cross-coupled to each other and N channel MOS transistors N2 and N3 cross-coupled to each other.

The sense amplifier SA are connected to bit lines BLL and ZBLL of the memory block MB#L through a bit line isolation gate BIGL and bit lines BLR and ZBLR of the memory block MB#R through a bit line isolation gate BIGR. In the memory block MB#L, a memory cell MC is placed corresponding to an intersection of the word line WLL and the bit line BLL or ZBLL and likewise, in the memory block MB#R, a memory cell MC is placed corresponding to an intersection of the word line WLR and the bit line BLR or ZBLR. In FIG. 25, memory cells MC are placed at the intersections between the word line WLL and the bit line ZBLL and between the word line WLR and the bit line ZBLR. Between the common bit lines CBL and ZCBL, there is provided a bit line equalize circuit BLEQ for precharging the common bit lines CBL and ZCBL, the corresponding bit lines BLR and ZBLR and the corresponding bit lines BLL and ZBLL to a predetermined intermediate voltage level in the standby state.

The bit line isolation gates BIGL and BIGR become conductive in response to bit line isolation instruction signals BLIL and BLIR respectively. Now, description will be given of operation of the sense amplifier circuit shown in FIG. 25 with reference to a signal waveform diagram shown in FIG. 26 simply.

It is assume that the word line WLL is selected in the memory block MB#L. When an active cycle starts, first the bit line isolation instruction signal BLIR falls from H level to L level according to an address signal to place the bit line isolation gate BLIR into the off state. With placement of the bit line isolation gate BLIR into the off state, the bit lines BLR and ZBLR of the memory block MB#R are isolated from the common bit lines CBL and ZCBL. On the other hand, the bit line isolation instruction signal BLIL maintains H level. Then, the word line WLL corresponding to an addressed row by a decode result of an address signal is driven to a selected state, and a voltage level of the word line WLL rises. In general, the selected word line WLL is driven to a level of a boosted voltage Vpp higher than the sense amplifier power supply voltage VCCA.

When the word line WLL is driven to the selected state, an access transistor included in a memory cell MC becomes conductive and a change in potential corresponding to information stored in the memory cell arises on the bit line ZBLL. In FIG. 26, there is shown an example of a signal waveform when a data at H level is read out onto the bit line ZBLL. The bit line BLL maintains an intermediate voltage (VCCA/2) set in a precharged state.

When a potential difference between the bit lines BLL and ZBLL is sufficiently large, sense amplifier activation signals SON and ZSOP are activated to make the sense amplifier activation transistors N1 and P1 conductive, respectively, and the ground voltage VSS and the sense amplifier power supply voltage VCCA are supplied to the sense amplifier SA, whereby the sense amplifier SA starts sensing operation.

The common bit lines CBL and ZCBL are connected to the bit lines BLL and ZBLL through the bit line isolation gate BLIL and by the sensing operation of the sense amplifier SA, the common bit lines CBL and ZCBL, and bit lines BLL and ZBLL are driven to the ground voltage VSS and the sense amplifier power supply voltage VCCA according to a memory data, respectively.

Thereafter, data access to a memory cell (data write/data read) is carried out by a column selection circuit not shown. In the memory block MB#R, the bit line isolation gate BIGR is in the off state and the bit lines BLR and ZBLR maintain the precharged state.

When the active cycle is completed, the selected word line WLL is driven to a non-selected state to turn the access transistor in the memory cell MC into the off state. Then, the sense amplifier activation signals SON and ZSOP are deactivated and the bit line isolation instruction signal BLIR goes to H level, so that the bit lines BLR and ZBLR of the memory block MB#R are connected to the common bit lines CBL and ZCBL. Then, the bit line equalizer BLEQ is activated and the bit lines BLR and ZBLR, BLL and ZBLL, and the common bit lines CBL and ZCBL are precharged to a level of the intermediate voltage (VCCA/2). The semiconductor memory device enters the standby cycle and waits for a next access.

A memory cell MC, as shown in FIG. 27, includes a capacitor MQ to store information, and an access transistor MT which connects the capacitor MQ with a bit line BL (or ZBL). The access transistor MT is constituted of an N channel MOS transistor (insulted gate type field effect transistor) and has a threshold voltage. The maximum voltage on the bit line BL is the sense amplifier power supply voltage VCCA transmitted by the sense amplifier. A boosted voltage Vpp which is sufficiently higher than (usually 1.5 times as high as) the array power supply voltage VCCA is transmitted onto the word lines WL (WLL and WLR) in order to transmit a signal at the array power supply voltage VCCA level to the memory capacitor MQ without any threshold voltage loss across the memory transistor MT. Thereby, the maximum array power supply voltage VCCA is transmitted to the memory capacitor MQ. When a voltage level of the array power supply voltage VCCA lowers, according to this voltage lowering a voltage level of a H level data stored in the memory capacitor MQ lowers. After the access transistor MT has been turned into the off state, a voltage level of the stored data at H level on the memory capacitor decreases gradually by a leakage current of the memory capacitor MQ. In a case where a voltage level of the array power supply voltage VCCA is low, the H voltage level of the stored data of the memory capacitor MQ lowers faster. Therefore, in this case, a charge holding characteristic (refresh characteristic) of the memory cell MC is deteriorated.

Further, when a voltage level of the array power supply voltage VCCA lowers, a voltage level transmitted to a power supply node of the sense amplifier SA lowers, thereby reducing an operating speed of the sense amplifier SA and deteriorating sensitivity thereof as well. With reduction in the sensitivity of sense amplifiers, a sense margin decreases accordingly, whereby there arises a problem that no correct sense operation of a memory cell data is effected. In this case, the memory cell data comes to be destroyed.

Therefore, in order to prevent reduction in sense margin and reduction in voltage level of a H level data in a memory cell from occurring, the power supply configuration in a meshed shape arrangement shown in FIG. 24 is adopted, thereby, resistance of the sense amplifier power supply line is smaller equivalently and a width of the power interconnection line is wider equivalently, so that a stable sense amplifier power supply voltage VCCA is supplied to the sense amplifier.

However, the sense amplifier power supply circuits, as shown in FIG. 24, are arranged at one end of the memory mat and distances from the active sense amplifier power supply circuits ACVG1 and ACVG2 to the memory blocks MB#1 to MB#n are different from one another. For this reason, values of equivalent resistance of sense amplifier power supply lines to the sense amplifier bands SB#0 to SB#n are different from one another. For example, when a sense amplifier operates in the sense amplifier band SA#0 and a voltage level of the sense amplifier power supply line SAPL of the sense amplifier band SB#0 lowers due to a sensing operation, then a current (or electric charge) is supplied from the active sense amplifier power supply circuits ACVG1 and ACVG2 provided at one end of a memory mat. Therefore, since power supply interconnection line resistance is the largest at the sense amplifier band SB#0, a current supply (electric charge supply) thereto is delayed and reduction in sense amplifier power voltage cannot sufficiently be compensated for. On the other hand, the sense amplifier band SB#n is the closest to the active sense amplifier power supply circuits ACVG1 and ACVG2 and equivalent interconnection line resistance of the sense amplifier power supply line is the smallest. In the sensing operation, an electric charge is supplied from the active sense amplifier power supply circuits ACVG1 and ACVG2 at a high speed and reduction in the power supply voltage VCCA can be suppressed, thus ensuring a high speed, correct sensing operation.

In a semiconductor memory device, a holding characteristic of a memory cell data is determined by the worst case. H level of a memory cell data of the memory block MB#1 driven by the sense amplifier bands SB#0 and SB#1 at the farthest positions cannot be restored sufficiently to the sense amplifier power supply voltage level VCCA, thereby deteriorating an electric charge holding characteristic of a memory cell, and further leading to degradation in an electric charge holding characteristic (a refresh characteristic) of a semiconductor memory device as a whole.

SUMMARY OF THE INVENTION

It is an object of the present invention to provide a semiconductor memory device whose data holding characteristic is improved.

It is another object of the present invention to provide a semiconductor memory device that can supplies a sense amplifier power supply voltage in a stable manner independently of a position of a sense amplifier band.

It is a further object of the present invention to provide a semiconductor memory device that can suppress reduction in sense amplifier power supply voltage in a uniform manner over a plurality of sense amplifier bands.

A semiconductor memory device according to a first aspect of the present invention includes a memory array including a plurality of memory blocks each having a plurality of memory cells arranged in rows and columns. The plurality of memory blocks are aligned along a column direction.

The semiconductor memory device according to the first aspect of the present invention further includes: a plurality of sense amplifier bands is at least placed between memory blocks adjacent along a column direction, each of which includes a sense amplifier circuit for sensing and amplifying a data on a selected memory cell of a corresponding memory block; and a power supply line laid extending over a plurality of memory blocks and the plurality of sense amplifier bands. The power supply line includes sense amplifier power supply lines each for supplying a power supply voltage to sense amplifier circuits of each of the sense amplifier bands. The sense amplifier power supply lines extend along a row direction in corresponding sense amplifier bands and connected to one another.

The semiconductor memory device according to the first aspect of the present invention further includes: a sense amplifier power supply voltage generation circuit for generating a control voltage; and a plurality of drive circuits provided corresponding to the sense amplifier bands, and activated when sense amplifier circuits of a corresponding sense amplifier band are active, for supplying currents to the corresponding sense amplifier power supply lines according to the control voltage.

A semiconductor memory device according to a second aspect of the present invention includes: a memory array having a plurality of memory cells arranged in rows and columns; a sense amplifier power supply voltage generation circuit for generating an internal power supply voltage; a plurality of sense amplifier circuits each operating using the internal power supply voltage as an operating power supply voltage when activated and each carrying out sensing and amplification of a data of a memory cell on a selected row of the memory array; and a drive circuit for supplying a current to an internal power supply line transmitting the internal power supply voltage when at least one of the plurality of sense amplifier circuits is active.

A drive circuit is provided corresponding to a sense amplifier band and a current is supplied to a corresponding sense amplifier power supply line from the corresponding drive circuit when a sense amplifier circuit of the corresponding sense amplifier band is active and thereby, a current is supplied to a sense amplifier power supply line from the drive circuit in the vicinity thereof independently of a distance from the sense amplifier power supply voltage generation circuit to a corresponding sense amplifier band, so that a delay of response and reduction in voltage caused by interconnection line resistance of the sense amplifier power supply line are suppressed and a voltage on the sense amplifier power supply line can be restored to a predetermined level of voltage at a high speed.

Further, a drive circuit is activated when a sense amplifier circuit is active and a current drive capability of a sense amplifier power supply voltage is made larger equivalently and thereby, with a large current drive capability, the sense amplifier power supply voltage can be supplied to a sense amplifier band at a remote location and reduction in voltage level of the sense amplifier power supply voltage can also be suppressed, with the result that in each of the sense amplifier bands, the sense amplifier power supply voltage at a predetermined level can be supplied in a stable manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram schematically showing an overall configuration of a semiconductor memory device according to a first embodiment of the present invention;

DESCRIPTION OF THE PREFERRED EMBODIMENTS

FIRST EMBODIMENT

Figure 2:
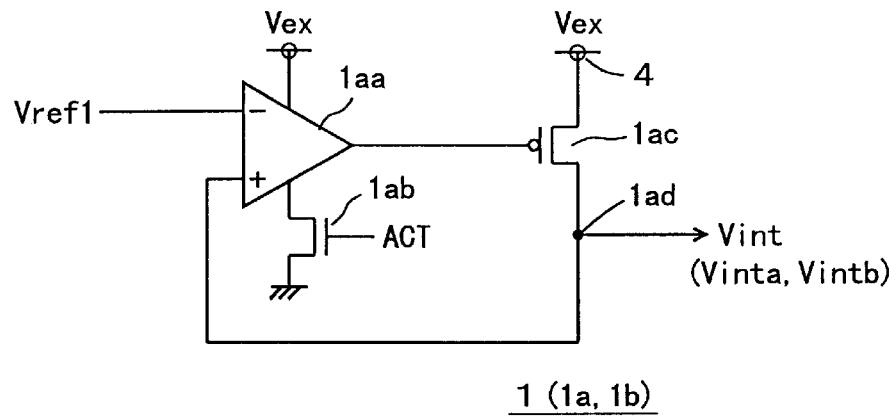
FIG. 2 is a diagram showing a configuration of an active sense amplifier power supply control circuit in FIG. 1.

FIG. 1 is a block diagram schematically showing an overall configuration of a semiconductor memory device according to a first embodiment of the present invention. In FIG. 1, a memory mat includes: memory blocks MB#0 to MB#n each having a plurality of memory cells arranged rows and column, and sense amplifier bands SB#0 to SB#n+1 placed between the memory blocks MB#0 to MB#n and outside both memory blocks MB#0 and MB#n. The sense amplifier bands SB#0 to SB#n+1 each include sense amplifier circuits arranged corresponding to columns of corresponding memory blocks, similar to a conventional device. In a case where the sense amplifier bands SB#0 to SB#n+1 are configured in a shared sense amplifier arrangement, sense amplifier circuits are located on alternate columns of a corresponding memory block.

In the memory mat, a sense amplifier power supply line and an array power line APL are laid, in meshed shape arrangements, over the sense amplifier bands SB#0 to SB#n+1 and the memory blocks MB#0 to MB#n and a sense amplifier power supply voltage VCCA is transmitted onto the array power line APL. Likewise, although a ground line transmitting the ground voltage is laid on the memory mat in a meshed shape arrangement, the ground line is not shown in FIG. 1 for simplicity.

Sense amplifier power supply lines SPL0 to SPLn+1 are laid down in the sense amplifier bands SB#0 to SB#n+1, respectively. The sense amplifier power supply lines SPL0 to SPLn+1 are connected to the array power lines APL at predetermined pitches. It should be noted that in FIG. 1, the array power lines APL are shown extending along a column direction. However, the array power lines APL are also arranged in a row direction in parallel.

Corresponding to the sense amplifier bands SB#0 to SB#n+1, there are provided power supply drivers 3a0 to 3an+1 and 3b0 to 3bn+1, respectively, for driving the corresponding sense amplifier power supply lines SPL0 to SPLn+1. The power supply drivers 3a0 to 3an+1 are activated in activation of sense amplifier activation signals SON0 and ZSOP0 to SONn+1 and ZSOPn+1, respectively, applied to corresponding sense amplifier bands to supply currents to the corresponding sense amplifier power supply lines SPL0 to SPLn+1 according to a control voltage Vinta from the active sense amplifier power supply control circuit 1a.

Likewise, the power supply drivers 3b0 to 3bn+1 are activated in activation of the sense amplifier activation signals SON0 and ZSOP0 to SONn+1 and ZSOPn+1, respectively, applied to corresponding sense amplifier bands to supply currents to the sense amplifier power supply lines SPL0 to SPLn+1 disposed in corresponding sense amplifier bands according to a control voltage Vintb from the active sense amplifier power supply control circuit 1b.

The power supply drivers 3a0 to 3an+1 are arranged along one side of the memory mat, aligned in a column direction while the power supply drivers 3b0 to 3bn+1 are arranged along the other side of the memory mat, aligned in a column direction. The sense amplifier power supply lines SPL0 to SPLn+1 are supplied with currents from both sides thereof and the power supply voltage levels thereof is restored at a high speed.

The array power line APL receives the array power supply voltage VCCA from the standby sense amplifier power supply circuit 2. The active sense amplifier power supply control circuits 1a and 1b are disposed at one end of the memory mat in a column direction.

The active sense amplifier power supply control circuits 1a and 1b are activated in an active cycle and produces the control voltages Vinta and Vintb defining a voltage level of the array power supply voltage (sense amplifier power supply voltage) VCCA.

In the configuration of the semiconductor memory device shown in FIG. 1, a row select operation, and sense and restore operations of a memory cell data are carried out only in a memory block specified by a block selection signal among the memory blocks MB#0 to MB#n. Therefore, when the memory block MB#0, for example, is specified by a memory block selection signal, sense amplifier circuits included in the sense amplifier bands SB#0 and SB#1 are activated by the sense amplifier activation signals SON0 and ZSOP0, and SON1 and ZSOP1, respectively. At this time, the power supply drivers $3a0$, $3a1$, $3b0$ and $3b1$ are also activated and currents are supplied to the corresponding sense amplifier power supply lines SPL0 and SPL1 according to control voltages Vinta and Vintb from the active sense amplifier power supply control circuits 1a and 1b, respectively, and voltage levels of the sense amplifier power supply lines SPL0 and SPL1 are set to the voltage levels corresponding to the control voltages Vinta and Vintb.

Therefore, since a sense amplifier power supply line SPLi is driven by power supply drivers $3ai$ and $3bi$ disposed in the vicinity of a sense amplifier band, the sense amplifier power supply line SPLi is driven by the power supply drivers $3ai$ and $3bi$ and reduction in a voltage level in a sense operation of a sense amplifier power supply voltage on the sense amplifier power supply line SPLi can be suppressed. Further, corresponding power supply drivers in the vicinity of a to-be-activated sense amplifier band supply a current to the corresponding sense amplifier power supply line and the current is supplied at highspeeding response to fluctuations in the sense amplifier power supply voltage, thereby enabling the corresponding sense amplifier power supply voltage to be restored to an original voltage at a high speed.

FIG. 2 is a diagram schematically showing a configuration of the active sense amplifier power supply control circuits 1a and 1b shown in FIG. 1. The active sense amplifier power supply control circuits 1a and 1b have the same configuration with each other and in FIG. 2, the circuits 1a and 1b are represented by an active sense amplifier power supply control circuit 1.

In FIG. 2, the active sense amplifier power supply control circuit 1 includes: a comparator 1aa that compares a reference voltage Vref1 with a control voltage Vint (Vinta and Vintb) when activated; an activation transistor 1aa for activating the comparator 1aa in response to activation of an array activation instruction signal ACT; and a current drive transistor 1ac connected between an external power supply node 4 receiving an external power voltage Vex and a control voltage output node 1ad, and supplying a current to the control voltage output node 1ad from the external power supply node 4 according to an output signal of the comparator 1aa.

The array activation instruction signal ACT is activated when a mode in which a row select operation is performed in the semiconductor memory device is instructed. In a standard DRAM(dynamic random access memory), for example, the array activation instruction signal ACT is activated in response to activation of a row address strobe signal /RAS applied externally. In a case of a synchronous memory such as SDRAM (synchronous DRAM), the array activation instruction signal ACT is activated when an active command to instruct activation of an array is applied.

In a standby cycle, the activation transistor $1ab$ is in the off state and an operating current flowing path in the comparator $1aa$ is cut off, whereby an output signal of the comparator $1aa$ is kept at H level of an external power supply voltage Vwex. At the H level of the output signal, the current drive transistor $1ac$ is the off state.

When the array activation instruction signal ACT is activated, the activation transistor $1ab$ is turned into the on state to form an operating current flowing path for the comparator $1aa$, thereby activating the comparator $1aa$. When the control voltage Vint is higher than the reference voltage Vref1, an output signal of the comparator $1aa$ goes to H level and the current drive transistor $1ac$ turns into the off state. On the other hand, when the control voltage Vint is lower than the reference voltage Vref1, then the output signal of the comparator 1aa goes to a low level according to a difference between the reference voltage Vref and the control voltage Vint, and a conductance of the current drive transistor $1ac$ increases. In response to the increase in conductance, a current is supplied from the external power supply node 4 to the control voltage output node 1ad to raise a voltage level of the control voltage Vint.

Therefore, the active sense amplifier power supply control circuit 1 (1a and 1b) maintains the control voltage Vint at the same level as the reference voltage Vref. According to the control voltage Vint, the power supply drivers $3a0$ to $3an+1$ and $3b0$ to $3bn+1$ shown in FIG. 1 supply currents to corresponding sense amplifier power supply lines in activation of sense amplifier circuits of corresponding sense amplifier bands and raise a voltage level of the sense amplifier power supply voltage (power supply voltage) at a high speed if the sense amplifier power supply voltage is low.

Figure 3:
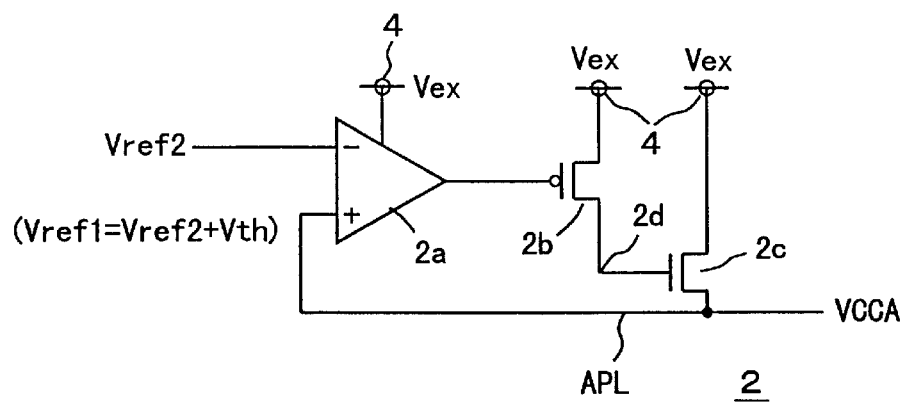
FIG. 3 is a diagram showing a configuration of a standby sense amplifier power supply circuit in FIG. 1.

FIG. 3 is a diagram showing a configuration of the standby sense amplifier power supply circuit 2 shown in FIG. 1. In FIG. 3, the standby sense amplifier power supply circuit 2 includes: a comparator $2a$ for comparing the reference voltage Vref with the array power supply voltage VCCA; a P-channel MOS transistor $2b$ supplying a current from the external power supply node 4 to an internal node $2d$ according to an output signal of the comparator $2a$; and a current drive transistor $2c$ supplying a current onto the array power line APL from the external power supply node 4 according to a voltage on the internal node $2d$. The reference voltage Vref2 is set to a value lower than the reference voltage Vref1 applied to the active sense amplifier power supply control circuit 1a by a threshold voltage Vth of the current drive transistor $2c$. This is, as detailed later, because a power supply driver $2c$ includes an N channel MOS transistor operating in a source follower mode, and voltage reduction by threshold voltage of the N channel MOS transistor arises in the power supply driver.

When the array power supply voltage VCCA is higher than the reference voltage Vref2, an output signal of the comparator $2a$ is at H level and the current drive transistor $2b$ is in the off state in the power supply circuit 2. When the array power supply voltage VCCA is higher than the reference voltage Vref2, a voltage between the gate and source of the current drive transistor 2c is smaller than the threshold voltage of the current drive transistor 2c and thereby, the current drive transistor 2c enters the off state (when the internal node 2d is in a floating state, a voltage level of the internal node 2d lowers due to a leakage current).

On the other hand, when the array power supply voltage VCCA is lower than the reference voltage Vref2, then the output signal of the comparator 2a goes to a low level corresponding to a difference between the array power supply voltage VCCA and the reference voltage Vref2, the current drive transistor 2b becomes conductive and a current is supplied to the internal node 2d from the external power supply node 4 to raise a voltage level of the node 2d. With rise in voltage of the node 2d, a voltage between the gate and source of the current drive transistor 2c increases, and a current flows to the array power line APL from the external power supply node 4 through the current drive transistor 2c to raise a voltage level of the array power supply voltage VCCA. Therefore, the standby sense amplifier power supply circuit 2 functions so as to maintain the array power supply voltage VCCA at a voltage level of the reference voltage Vref2. The standby sense amplifier power supply circuit 2 operates all the time and has a comparatively small current drive capability and compensate for reduction in the array power supply voltage VCCA due to a leakage current in the standby cycle.

It should be noted that the reference voltage Vref2 can be produced by down-converting the reference voltage Vref1 using a diode-connected MOS transistor.

Figure 4:
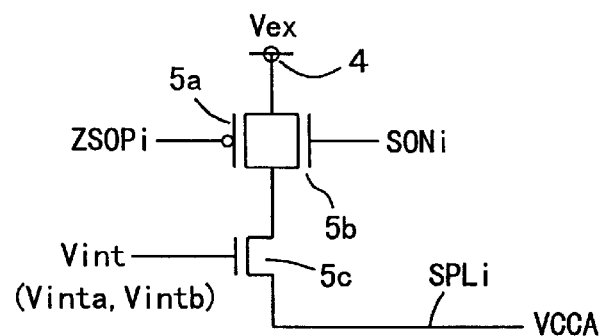
FIG. 4 is a circuit diagram of a configuration of a power supply driver shown in FIG. 1.

FIG. 4 is a circuit diagram of a configuration of the power supply drivers 3a0 to 3an+1 and 3b0 to 3bn+1 shown in FIG. 1. In FIG. 4, since the power supply drivers 3a0 to 3an+1 and 3b0 to 3bn+1 have the same configuration as one another, a configuration of one power supply driver 3 (3ai and 3bi) is shown as representative.

In FIG. 4, the power supply driver 3 includes: a P channel MOS transistor 5a that is connected to the external power supply node 4, and becomes conductive in response to activation of the sense amplifier activation signal ZSOPi for a sense amplifier circuit of a corresponding sense amplifier band; a N channel MOS transistor 5b, connected in parallel to the P channel MOS transistor 5a, and made conductive in response to activation of the sense amplifier activation signal SONi for the sense amplifier circuit of the corresponding sense amplifier band; and an N channel MOS transistor (current drive element) 5c connected between the MOS transistors 5a and 5b, and the sense amplifier line SPLi, and receiving the control voltage Vint at its gate.

When a corresponding sense amplifier circuit is in an inactive state, the MOS transistors 5a and 5b are both in the off state in the power supply driver 3 and no current is supplied to the sense amplifier power supply line SPLi from the MOS transistor 5c regardless of a voltage level of the control voltage Vint.

On the other hand, when the sense amplifier circuit of the corresponding sense amplifier band is active, switch transistors 5a and 5b becomes conductive and the external power supply node 4 is connected to the MOS transistor 5c. In this state, the MOS transistor 5c supplies a current from the external power supply node 4 to the sense amplifier power supply line SPLi according to a difference between the control voltage Vint and the array power supply voltage (sense amplifier power supply voltage) VCCA. When a voltage between the gate and source (=Vint−VCCA) of the MOS transistor 5c exceeds a threshold voltage Vth thereof, the MOS transistor 5c supplies a current from the external power supply node 4 to the sense amplifier power supply line SPLi. When a current supply capability of the MOS transistor 5c is comparatively larger, then reduction in the sense amplifier power supply voltage VCCA due to bit line charge/discharge caused by the sense amplifier circuit in operation, can be suppressed, a sense operation can be correctly carried out, whereby a data at a predetermined voltage level can be written into a memory cell capacitor.

The current drive MOS transistor 5c of each of the power supply drivers 3a0 to 3an+1 and 3b0 to 3bn+1 has a current drive capability of the same level as a conventional power supply drive transistor. Now, description will be made of operations of a semiconductor memory device according to the first embodiment of the present invention with reference to a signal waveform diagram shown in FIG. 5.

Figure 5:
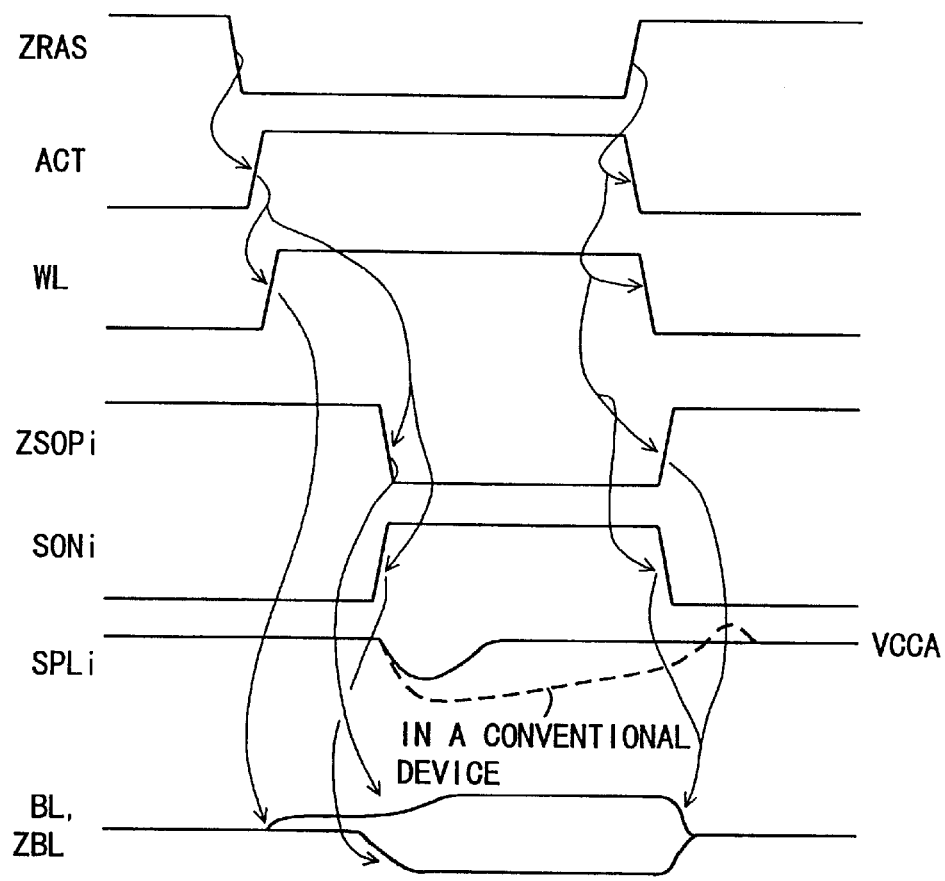
FIG. 5 is a signal waveform diagram representing operations of the semiconductor memory device shown in FIG. 1.

For example, when a row address strobe signal ZRAS from an outside goes to L level, then an active cycle starts and the array activation instruction signal ACT in the inside enters an active state at H level. When the array activation instruction signal ACT goes into the active state, then a decode operation of a row address signal is carried out in the inside to select a memory block, and following to the selection of a memory block, a word line WL arranged corresponding to an addressed row in the selected memory block is driven into a selected state. When the word line WL is driven into the selected state, a data of a memory cell connected to the word line WL is read out onto a corresponding bit line BL or ZBL. In FIG. 5, there is shown a state in which a H level data is read out. Then, the sense amplifier activation signals SONi and ZSOPi for the selected memory block are activated at respective predetermined timings in response to activation of the array activation instruction signal ACT. With the activation of the sense amplifier activation signals, a sense amplifier circuit is activated in a sense amplifier band for the selected memory block and voltage levels of the bit lines BL and ZBL are driven to the array power supply voltage VCCA and the ground voltage Vss according to the memory cell data.

In the sense operation, the array power supply voltage VCCA on the sense amplifier power supply line SPLi is consumed because of charging the bit line, thereby reducing the sense power supply line voltage (the array power supply voltage on the sense amplifier power supply line SPLi). However, each of the MOS transistors 5a and 5b of the power supply driver 3 shown in FIG. 4 enters the on state in the sense operation and thereby, the MOS transistor 5c supplies a current to the sense amplifier power supply line SPLi according to the control voltage Vint to raise a reduced voltage level of the sense amplifier power supply voltage. With such operations carried out, in a restore operation for a selected memory cell, a H voltage level on the bit lines BL and ZBL assumes the array power supply voltage VCCA level, thereby, enabling a restore operation of a memory cell data to be correctly performed.

That is, conventionally, a voltage level of the sense amplifier power supply line SPLi, as shown with a broken line in FIG. 5, goes to a low state since a current supply operation is delayed because of interconnection line resistance of a sense amplifier power supply line dependent on a distance from the active power supply circuit and thereby, a level of the sense amplifier power supply voltage is not sufficiently restored to its original array power supply voltage VCCA level. By supplying a current from power supply drivers in the vicinity of the sense amplifier band, the current can be supplied at a high speed according to reduction in the sense amplifier power supply voltage without any influence of interconnection line resistance of the array power supply line, thereby enabling reduction in the sense amplifier power supply voltage to be suppressed.

In a non-selected sense amplifier band, a voltage level of the sense amplifier power supply voltage is maintained by the standby sense amplifier power supply circuit 2. Further, a current is supplied to a sense amplifier power supply line through power supply drivers in the vicinity of a sense amplifier band, and therefore, there is no necessity to supply currents to the whole of the memory mat from active sense amplifier power supply circuits provided at one end of the memory mat during a active cycle period, thereby realizing a lower consumption of current. Further, in this case, there are only provided a transistor for current driving and a switch transistor connecting the current driving transistor to a power supply node, which enables increase in chip area to be sufficiently suppressed.

Modification

Figure 6:
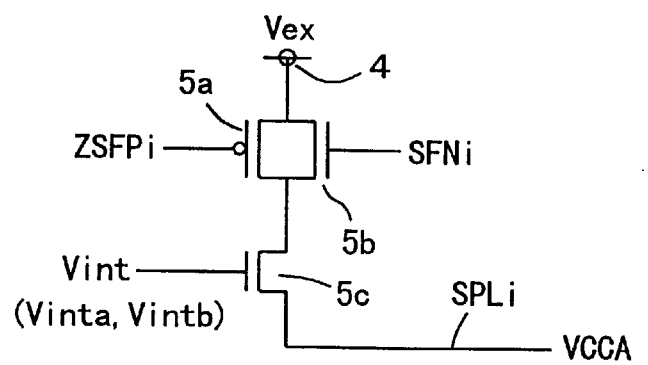
FIG. 6 is a circuit diagram showing a configuration of a power supply driver according to a modification of the first embodiment of the present invention.

FIG. 6 is a circuit diagram showing a configuration of a main part of a modification of the first embodiment of the present invention. In the configuration shown in FIG. 6, control signals ZSFPi and SFNi are provided to MOS transistors 5a and 5b. The control signals ZSFPi and SFNi are activated when a large bit line charge/discharge current flows in a sense operation.

Figure 7:
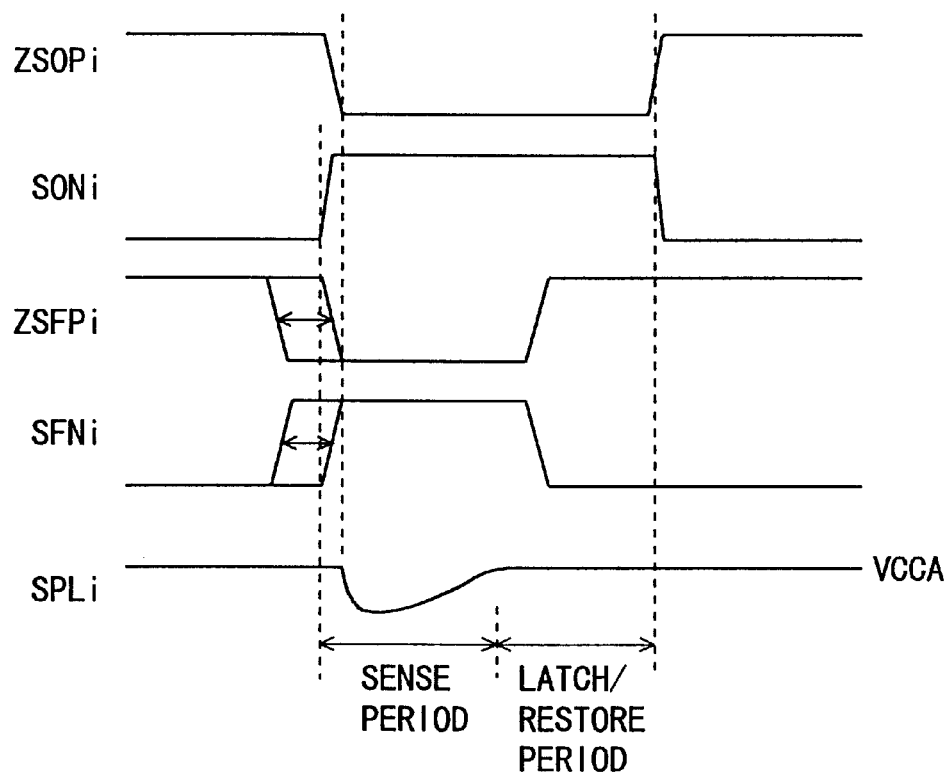
FIG. 7 is a signal waveform diagram representing operations of the power supply driver shown in FIG. 6.

FIG. 7 is a signal waveform diagram showing operations of the power supply driver shown in FIG. 6. Control signals ZSFPi and SFNi are activated in activation of the sense amplifier activation signals ZSOPi and SONi or prior to the activation thereof by a predetermined period. A sense amplifier circuit operates and performs a sensing operation in a corresponding sense amplifier band in response to the activation of the sense amplifier activation signals SONi and ZSOPi. Charge/discharge of a bit line is carried out during the sensing operation and the sense amplifier power supply voltage is consumed. When the sensing operation is completed, a voltage of the bit line is held by a sense amplifier. In this latch state, rewrite (restore) of a data of a memory cell is performed. In the restore operation, since the sense amplifier is of a CMOS circuit, almost no current is consumed. Therefore, the control signals ZSFPi and SFNi each are driven to an active state during a period including at least a sense period, during which the MOS transistors 5a and 5b shown in FIG. 6 are made conductive, and a current is supplied to the sense power supply line SPLi, thereby suppressing reduction in level of the sense amplifier power supply voltage.

In this case as well, only when a sense amplifier circuit consumes a large current, power supply drivers each are activated, reduction in the sense amplifier power supply voltage is suppressed to ensure a sensing operation to be performed, thereby enabling a data at the array power supply voltage VCCA to be written to memory capacitors.

Figure 8:
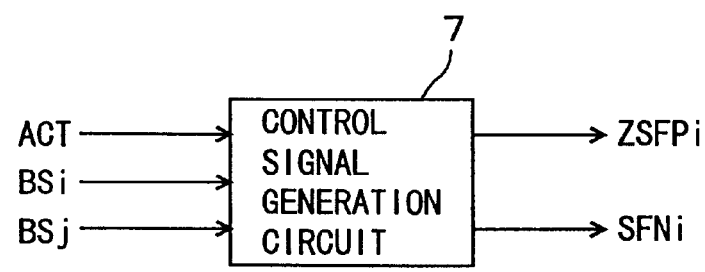
FIG. 8 is a schematic diagram showing a configuration of a power supply driver control signal generation section shown in FIG. 6.

FIG. 8 is a diagram schematically showing a configuration of section for generating the control signals SFNi and ZSFPi. In FIG. 8, a control signal generation circuit 7 receives an array activation instruction signal ACT and memory block selection signals BSi and BSj to generate the control signals ZSFPi and SFNi.

When one of the corresponding block selection signals BSi and BSj is in a selected state, a one shot pulse signal with a predetermined time width is generated in a predetermined timing to generate the control signals ZSFPi and SFNi. The block selection signals BSi and BSj select memory blocks MB#i and MB#j adjacent to each other and shares a sense amplifier band SB#i. Power supply drivers can be active for a selected sense amplifier band for a necessary period when selected.

As described above, according to the first embodiment of the present invention, since a power supply driver is provided corresponding to sense amplifier band, and a current is supplied to a sense amplifier power supply line in a corresponding sense amplifier band from a power supply node during operation of the corresponding sense amplifier band, therefore the current can be supplied to the sense amplifier power supply line at a high speed and thereby, reduction in the sense amplifier power supply voltage can be suppressed. Further, the current is supplied from both ends of the sense amplifier power supply line through the power supply drivers and thereby, a voltage level of the sense amplifier power supply line can restore to its original level without any influence of the interconnection line resistance.

SECOND EMBODIMENT

Figure 9:
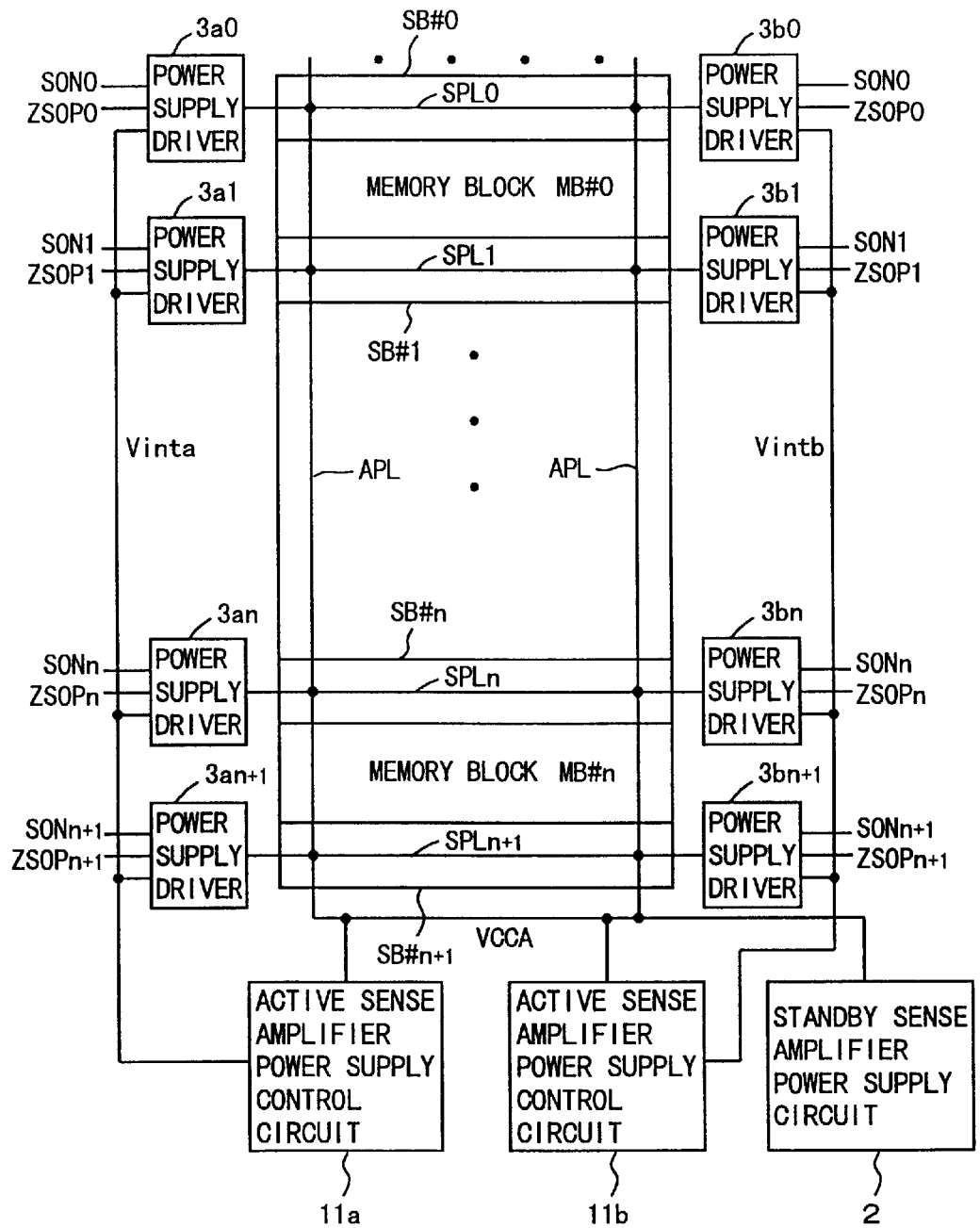
FIG. 9 is a block diagram schematically showing an overall configuration of a semiconductor memory device according to a second embodiment of the present invention.

FIG. 9 is a block diagram schematically showing an overall configuration of a semiconductor memory device according to a second embodiment of the present invention. In the configuration shown in FIG. 9, active sense amplifier power supply/control circuits 11a and 11b are arranged at one end of a memory mat. The active sense amplifier power supply/control circuits 11a and 11b, both, generate and transmit the array power supply voltage VCCA to the array power line APL when activated and further generate the control voltages Vinta and Vintb in parallel when activated. The other configuration is the same as that shown in FIG. 1, and corresponding portions are denoted by the same reference characters.

In the configuration shown in FIG. 9, the array power line APL is supplied with a current in the active cycle by the active sense amplifier power supply/control circuits 11a and 11b, thereby suppressing reduction in voltage level of the array power supply voltage VCCA. Therefore, in the power supply drivers 3a0 to 3an+1 and 3b0 to 3bn+1, each of the power supply drive elements is configured to have such a current drive capability to suppress reduction in the sense amplifier power supply voltage in the worst case where only the active sense amplifier power supply/control circuits 11a and 11b are used. Therefore, chip occupation area of the power supply drivers 3a0 to 3an+1 and 3b0 to 3bn+1 can be smaller than in the case of the first embodiment in total.

Figure 10:
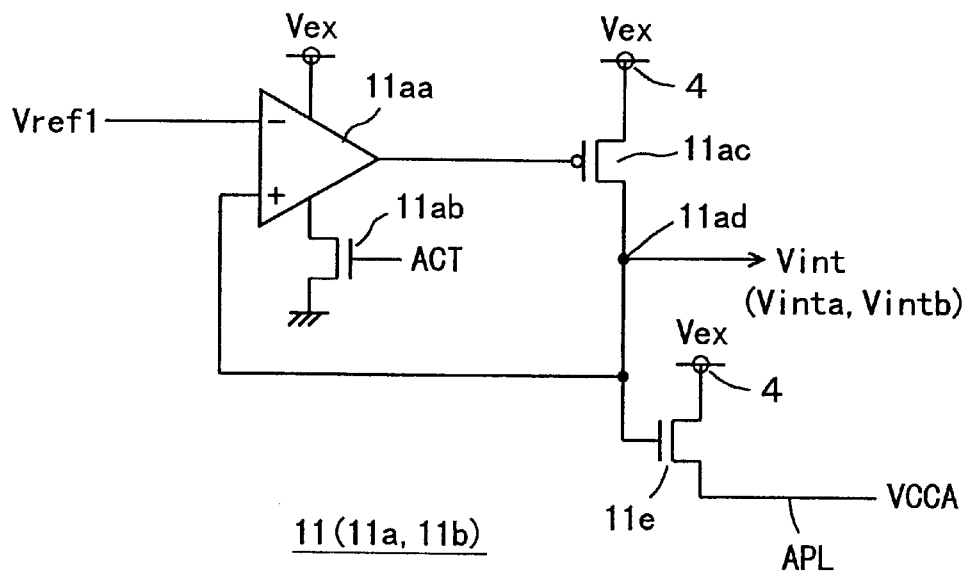
FIG. 10 is a diagram schematically showing a configuration of an active sense amplifier power supply/control circuit shown in FIG. 9.

FIG. 10 is a diagram schematically showing a configuration of the active sense amplifier power supply/control circuits 11a and 11b shown in FIG. 9. Since the active sense amplifier power supply/control circuits 11a and 11b have the same configuration with each other, an active sense amplifier power supply/control circuit 11 is shown as a representative in FIG. 10.

In FIG. 10, the active sense power supply/control circuit 11 includes: a comparator 11aa receiving the control voltage Vint and the reference voltage Vref1; an activation transistor 11ab activating the comparator 11aa in response to an array activation instruction signal ACT; a current drive transistor 11ac supplying a current from the external power supply node 4 to an internal node 11ad according to an output signal of the comparator 11aa; and a current drive transistor 11e supplying a current from the external power supply node 4 to the array power line APL according to the control voltage Vint. The current drive transistor 11ac is constituted of a P channel MOS transistor while the current drive transistor 11e is constituted of an N channel MOS transistor.

In the active sense amplifier power supply control circuit 11 in the configuration shown in FIG. 10, the comparator 11aa controls a conductance of the current drive transistor 11ac such that the control voltage Vint output from the node 11*ad* equals the reference voltage Vref1 when activated. The current drive transistor 11*e* operates in a so-called source follower mode (the control voltage Vint is lower than the external power supply voltage) and drives the array power supply voltage VCCA to a voltage level lower than the control voltage Vint by the threshold voltage thereof.

Therefore, since the current drive transistor 11*e* is provided to supply a current to the array power line APL during an active cycle according to a difference between the array power supply voltage VCCA and the control voltage Vint, therefore an N channel MOS transistor for current driving of each of the power supply drivers 3*a*0 to 3*a*n+1 and 3*b*0 to 3*b*n+1 can be smaller in size.

It should be noted that a control operation on each of the power supply drivers 3*a*0 to 3*a*n+1 and 3*b*0 to 3*b*n+1 in this embodiment is the same as in the first embodiment and the configuration of the modification of the first embodiment may be employed in the second embodiment.

As described above, according to the second embodiment, in an active cycle as well, a current is supplied to an array power supply line from active sense amplifier power supply/control circuits and reduction in the array power supply voltage, or the sense amplifier power supply voltage can be suppressed. Further, a size (a channel width W) of a current drive transistor constituting a power supply driver can be smaller, thereby enabling a smaller occupation area of the power supply driver.

THIRD EMBODIMENT

Figure 11:
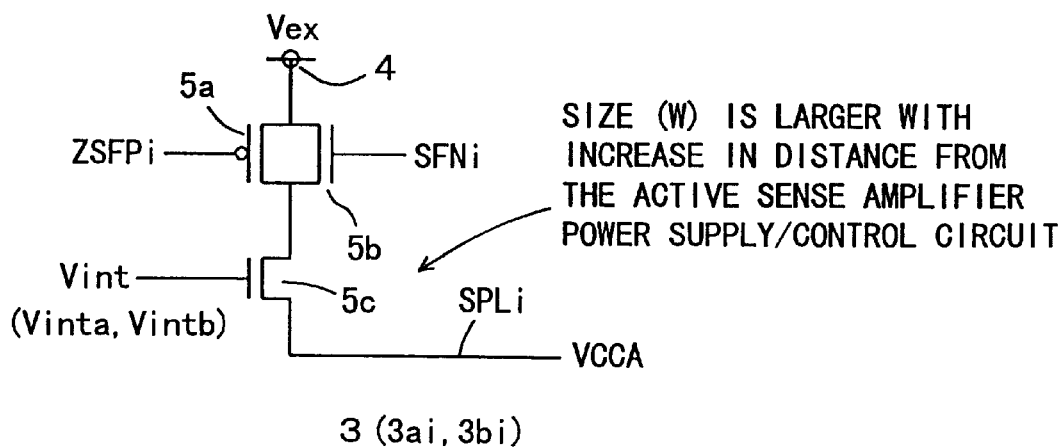
FIG. 11 is a circuit diagram showing a configuration of a power supply driver according to a third embodiment of the present invention.

FIG. 11 is a circuit diagram showing a configuration of a power supply driver 3 according to a third embodiment of the present invention. In the third embodiment, a size (a channel width W) of a current drive MOS transistor 5*c* used in a power supply driver 3 is set so as to increases as a distance from the active sense amplifier power supply/control circuits 11*a* and 11*b* increases. That is, a size (a channel width W) of the current driving MOS transistor 5*c* used for the sense amplifier band SB#0 located at the farthest position from the active sense amplifier power supply/control circuits 1ia and 11*b* is the largest.

Further, a size (a channel width W) of a MOS transistor 5*c* for a power supply driver included in one of the power supply drivers 3*a*n+1 and 3*b*n+1 provided for the sense amplifier band SB1#n+1 closest to the active sense amplifier power supply/control circuits 11*a* and 11*b* is the smallest.

Figure 12:
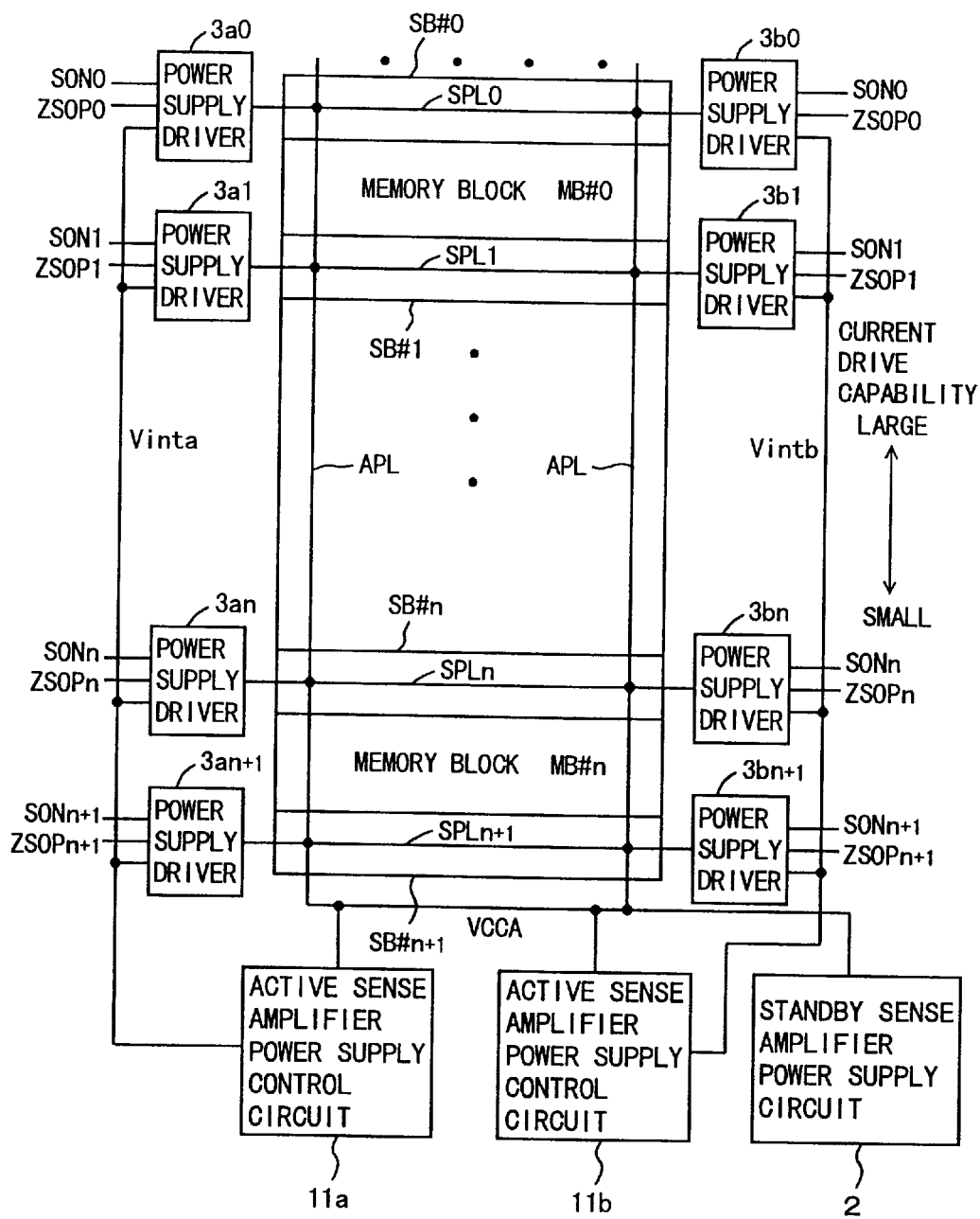
FIG. 12 is a circuit diagram schematically showing an overall configuration of a semiconductor memory device according to the third embodiment of the present invention.

FIG. 12 is a circuit diagram schematically showing an overall configuration of a semiconductor memory device according to the third embodiment of the present invention. In FIG. 12, a size (a ratio of a channel width to a channel length, W/L) of a current driving MOS transistor 5*c* included in the power supply drivers 3*a*0 and 3*b*0 is the largest and a size of a current drive MOS transistor 5*c* included in the power supply drivers 3*a*n+1 and 3*b*n+1 is the smallest. A current drive capability of a MOS transistor is determined by the ratio of a channel width to a channel length, W/L. Therefore, the current drive capabilities of the power supply drivers 3*a*0 and 3*b*0 are the largest and the current drive capabilities of the power supply drivers 3*a*n+1 and 3*b*n+1 are the smallest as shown in FIG. 12.

The active sense amplifier power supply/control circuits 11*a* and 11*b* are activated in an active cycle and supply currents to the sense amplifier power supply lines SPL0 to SPLn+1 through the array power line APL. In this situation, a voltage restoration speed of the sense amplifier power supply line SPL0 provided in the sense amplifier band SB#0 is the lowest due to interconnection line resistance. A reduction in the voltage restoration speed can be compensated for an increase in a current drive capability of each of the power supply drivers 3*a*0 and 3*b*0, to restore to its original voltage level at a high speed. On the other hand, the sense amplifier power supply line SPLn+1 provided in the sense amplifier band SB#n+1 is closest to the active sense amplifier power supply/control circuits 11*a* and 11*b*, a current is supplied at a high speed and a proportion of reduction in voltage level is small. Therefore, even when current drive capabilities of each of the power supply drivers 3*a*n+1 and 3*b*n+1 is smaller, the reduced sense amplifier power supply voltage can be restored to its original voltage at a high speed because of a smaller reduction in the sense amplifier power supply voltage. With such current drive capabilities of the power supply drivers, reductions in voltage level of sense amplifier power supply voltages of the sense amplifier power supply lines SPL0 to SPLn+1 can be restored at almost the same speed, thereby enabling improvement on a refresh characteristic and a sensing margin.

It should be noted that in the third embodiment, a drive control method for the power supply drivers 3*a*0 to 3*a*n+1 and 3*b*0 to 3*b*n+1 is the same as in the first embodiment and further, a configuration of the active sense amplifier power supply/control circuits 11*a* and 11*b* are the same as that of the second embodiment.

As described above, according to the third embodiment of the present invention, since a current drive capability of a power supply driver is set to the level according to a distance from active sense amplifier power supply/control circuits, and a voltage on each sense amplifier power supply line can be restored to its original value at a speed according to a proportion of reduction in voltage level thereof, therefore distribution of sense amplifier power supply voltages in sense amplifier bands due to distances from the active sense amplifier power supply circuits can be prevented from occurring, decrease in sensing margin can be suppressed, a data at an array power supply voltage level can be sure to be written to a memory cell and furthermore, a refresh characteristic is improved.

FOURTH EMBODIMENT

Figure 13:
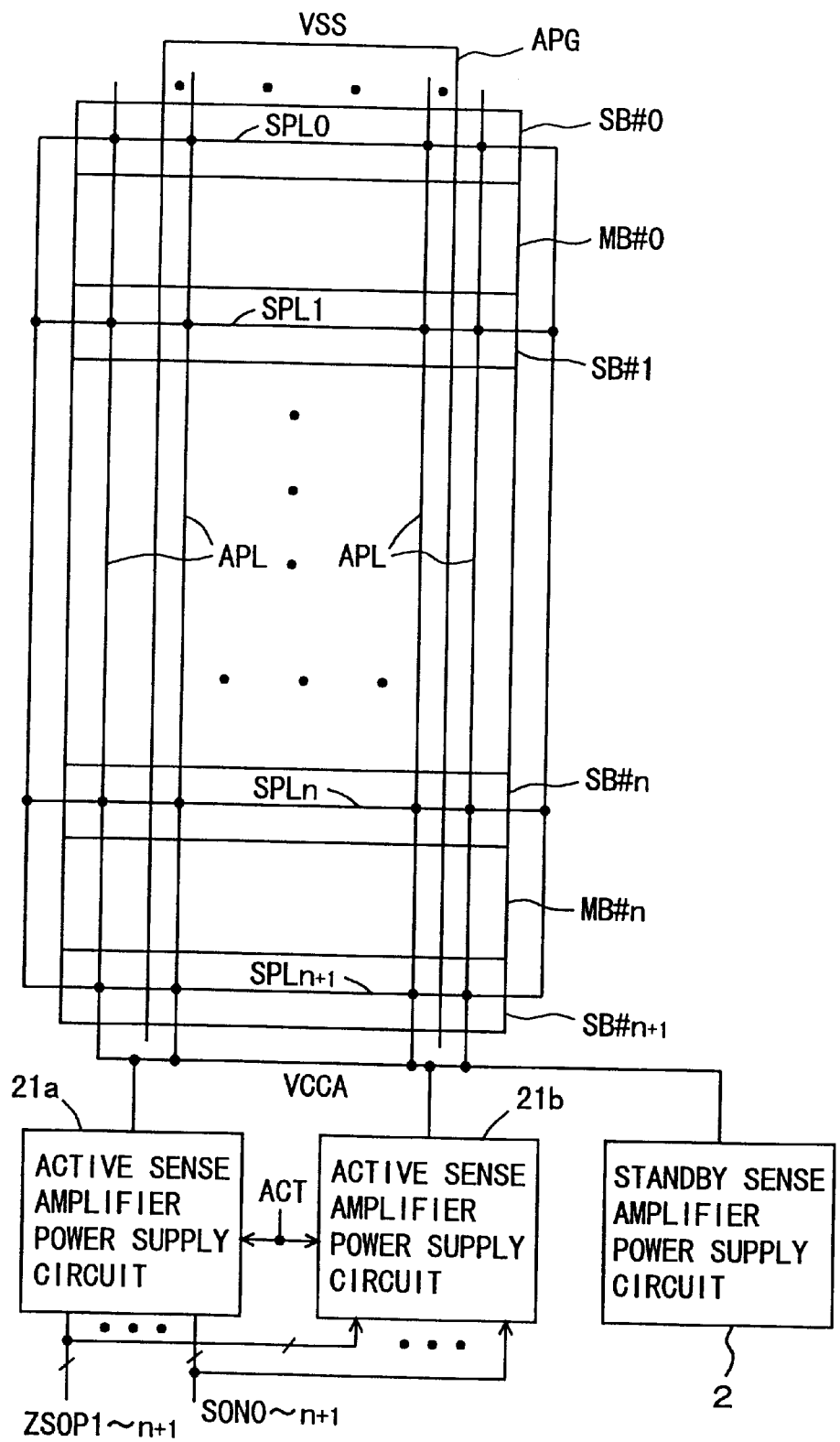
FIG. 13 is a circuit diagram showing a configuration of a main part of a semiconductor memory device according to a fourth embodiment of the present invention.

FIG. 13 is a circuit diagram schematically showing a configuration of a main part of a semiconductor memory device according to a fourth embodiment of the present invention. In the configuration shown in FIG. 13, active sense amplifier power supply circuits 21*a* and 21*b* receive the array activation instruction signal ACT and the sense amplifier activation signals ZSOP1 to ZSOPn+1 and SON0 to SONn+1. The active sense amplifier power supply circuits 21*a* and 21*b* each have a larger current drive capability in activation of the sense amplifier activation signals ZSOP1 to ZSOPn+1 and SON0 to SONn+1. The array power supply voltage VCCA output from the active sense amplifier power supply circuits 21*a* and 21*b* are transmitted onto the array power line APL. The array power line APL laid in a meshed shape arrangement on the memory mat is connected to the sense amplifier power supply lines SPL0 to SPLn+1 in the sense amplifier bands SB#0 to SB#n+1, respectively. The array ground line APG transmitting the ground voltage VSS are laid in parallel to the array power line APL. The array ground line APG is also connected to sense amplifier ground lines transmitting the sense amplifier ground voltage in the sense amplifier bands SB#0 to SB#n+1, respectively.

The active sense amplifier power supply circuits 21*a* and 21*b* each increase a current drive capability thereof when a sensing operation is performed. When a row select operation starts, the peripheral circuitry carries out the row select operation using a peripheral power supply voltage. In this situation, the array power supply voltage VCCA is not consumed and requirements in levels for the current drive capabilities of the active sense amplifier power supply circuits 21a and 21b are not so high. During charge/discharge of a bit line in a sensing operation, the current drive capabilities of the active sense amplifier power supply circuits 21a and 21b increase to suppress reduction in the sense amplifier power supply voltages. By such an action, reduction in the sense amplifier power supply voltage on the sense amplifier power supply line SPL0 even in the sense amplifier band SB#0 farthest from the active sense amplifier power supply circuits 21a and 21b can be suppressed by current supplied from the active sense amplifier power supply circuits 21a and 21b with increased current drive capabilities.

Figure 14:
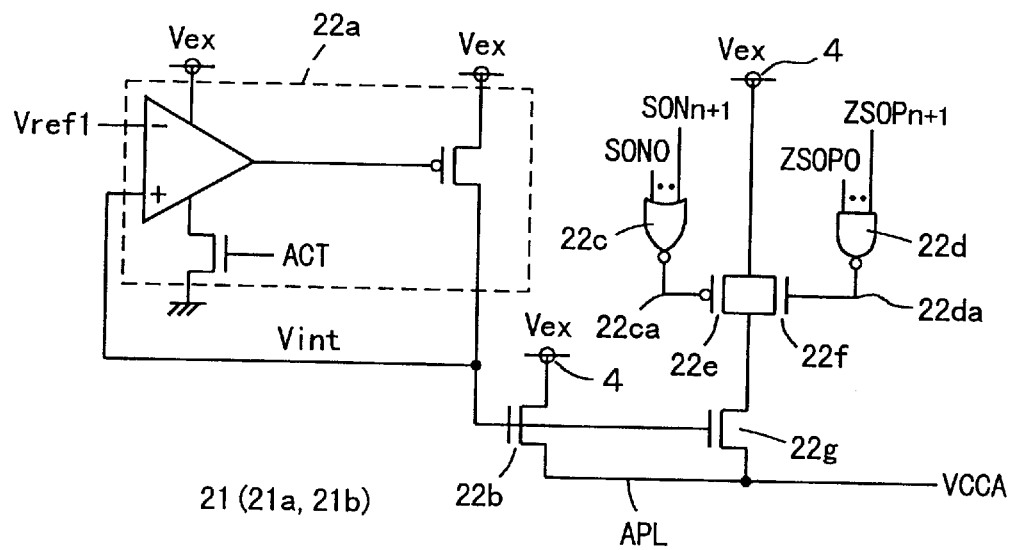
FIG. 14 is a diagram showing a configuration of an active sense amplifier power supply/control circuit shown in FIG. 13.

FIG. 14 is a diagram showing an example of a configuration of the active sense amplifier power supply circuits 21a and 21b shown in FIG. 13. In FIG. 14, since the active sense amplifier power supply circuits 21a and 21b have the same configuration with each other, there is shown an active sense amplifier power supply circuit 21.

In FIG. 14, the active sense amplifier power supply circuit 21 includes: a control voltage generation circuit 22a adjusting a voltage level of the control voltage Vint according to the result of comparison of the reference voltage Vref1 with the control voltage Vint; an N channel MOS transistor 22b supplying a current to the array power line APL according to the control voltage Vint; a NOR gate 22c receiving the sense activation signals SON0 to SONn+1; a NAND circuit 22d receiving the sense activation signals ZSOP0 to ZSOPn+1; an N channel MOS transistor 22e connected to the external power supply node 4 and made conductive when an output signal of the NOR circuit 22c is at L level; an N channel MOS transistor 22f connected to the external power supply node 4 and made conductive when an output signal of the NAND circuit 22d is at H level; and an N channel MOS transistor 22g connected between each of the MOS transistors 22e and 22f, and the array power line APL, and receiving the control voltage Vint at the gate thereof.

Figure 15:
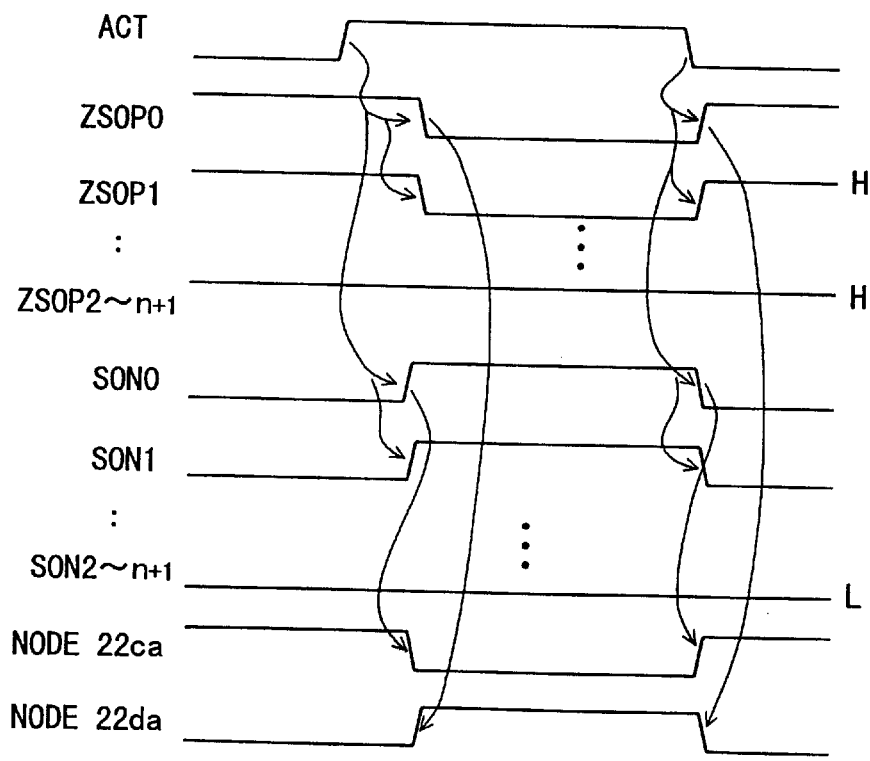
FIG. 15 is a signal wave form diagram representing operations of the active sense amplifier power supply/control circuit shown in FIG. 14.

N channel MOS transistors 22b and 22g have the same size (a channel width) with each other and each have a current drive capability of the same level as other. Now, description will be given of operations of the active sense power supply circuit 21 shown in FIG. 14 with reference to a signal waveform diagram shown in FIG. 15.

When an active cycle starts, the array activation instruction signal ACT is activated and goes to H level. Thereby, the control voltage generation circuit 22a is activated and maintains the control voltage Vint at a voltage level of the reference voltage Vref1. MOS transistor 22b supplies a current from the external power supply node 4 to the array power line APL according to a difference between the control voltage Vint and the array power supply voltage VCCA and maintains the array power supply voltage VCCA at a voltage lower than the control voltage Vint by a threshold voltage Vth thereof. After a row (a word line) is selected and a memory cell data is read out onto a corresponding bit line, a sensing operation starts.

Now, a case is considered where the memory block MB#0 includes a selected row. In this case, since sense amplifiers in the sense amplifier bands SB#0 and SB#1 are activated, the sense amplifier activation signals ZSOP0, ZSOP1, SON0 and SON1 are activated. The other sense amplifier instruction signals ZSOP2 to ZSOPn+1 and SON2 to SONn+1 each maintain a non-activated state. In response to the activation of the signals, an output signal of the NOR circuit 22c goes to L level, while an output signal of the NAND circuit 22d goes to H level, the MOS transistors 22e and 22f become conductive and the MOS transistor 22g is connected to the external power supply node 4. The MOS transistor 22g supplies a current from the external power supply node 4 to the array power line APL according to a difference between the control voltage Vint and the array power supply voltage VCCA. Therefore, a current is supplied to the array power line APL in a sensing operation by the two MOS transistors 22b and 22g and a current drive capability of the active sense amplifier power supply circuit 21 is made larger and thereby, reduction in voltage level of the array power supply voltage VCCA is suppressed.

It should be noted that in the configuration shown in FIG. 14 as well, the NOR circuit 22c and the NAND circuit 22d may make the MOS transistors 22i and 22j conductive not during all the period in which the sense amplifier activation signal is active but only during a predetermined period including a period in which a sensing operation is carried out.

Modification

Figure 16:
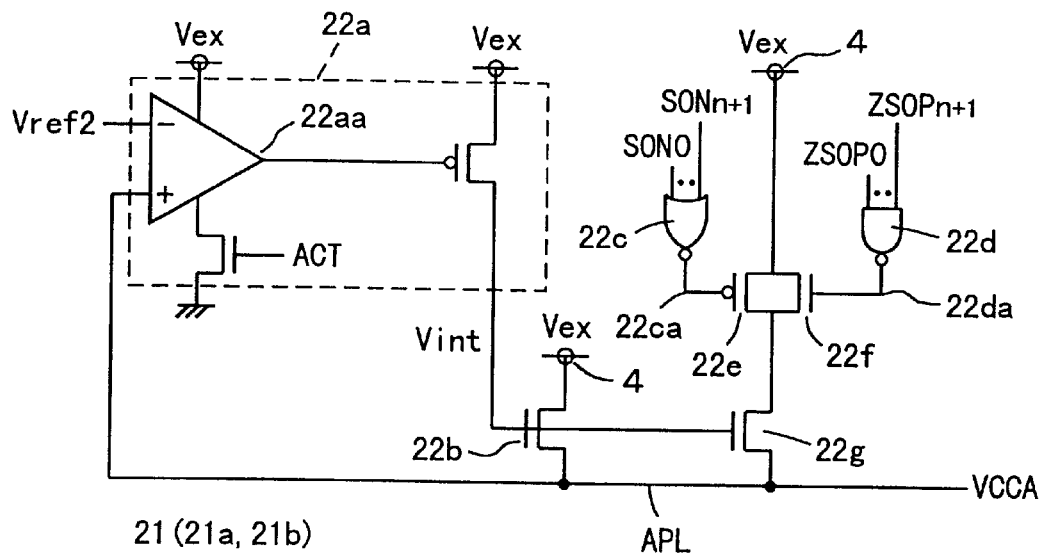
FIG. 16 is a circuit diagram showing a modification of the fourth embodiment of the present invention.

FIG. 16 is a circuit diagram showing a modification of the fourth embodiment of the present invention. In the active sense amplifier power supply circuit 21 (21a and 21b) shown in FIG. 16, a comparator 22aa of a control voltage generation circuit 22a compare the reference voltage Vref2 and the array power supply voltage VCCA with each other. The other configuration is the same as that shown in FIG. 14 and corresponding components of FIG. 14 are denoted by the same reference numbers as those shown in FIG. 14.

In a case of the configuration shown in FIG. 16, a voltage level of the control voltage Vint is adjusted according to a difference between the array power supply voltage VCCA and the reference voltage Vref2. Therefore, a voltage level of the control voltage Vint is adjusted according to reduction in level of the array power supply voltage VCCA. Current drive MOS transistors 22b and 22g supply a current from the external power supply node 4 to the array power line APL according to a difference between the control voltage Vint and the array power supply voltage VCCA. Therefore, in the configuration shown in FIG. 16 as well, a current drive capability of the active sense amplifier source circuit 21 (21a and 21b) is made larger in a sensing operation and reduction in level of the sense amplifier power supply voltage of a selected sense amplifier band (a sense amplifier band whose corresponding sense amplifier activation signal is in an active state) can be suppressed according to the reduction in voltage level of the array power supply voltage VCCA.

As described above, according to the fourth embodiment of the present invention, a current drive capability of each of active sense amplifier power supply circuits supplying a sense amplifier power supply voltage to a sense amplifier circuit is made larger in a sensing operation, thereby enabling reduction in the sense amplifier power supply voltage in the sensing operation to be suppressed surely.

FIFTH EMBODIMENT

Figure 17:
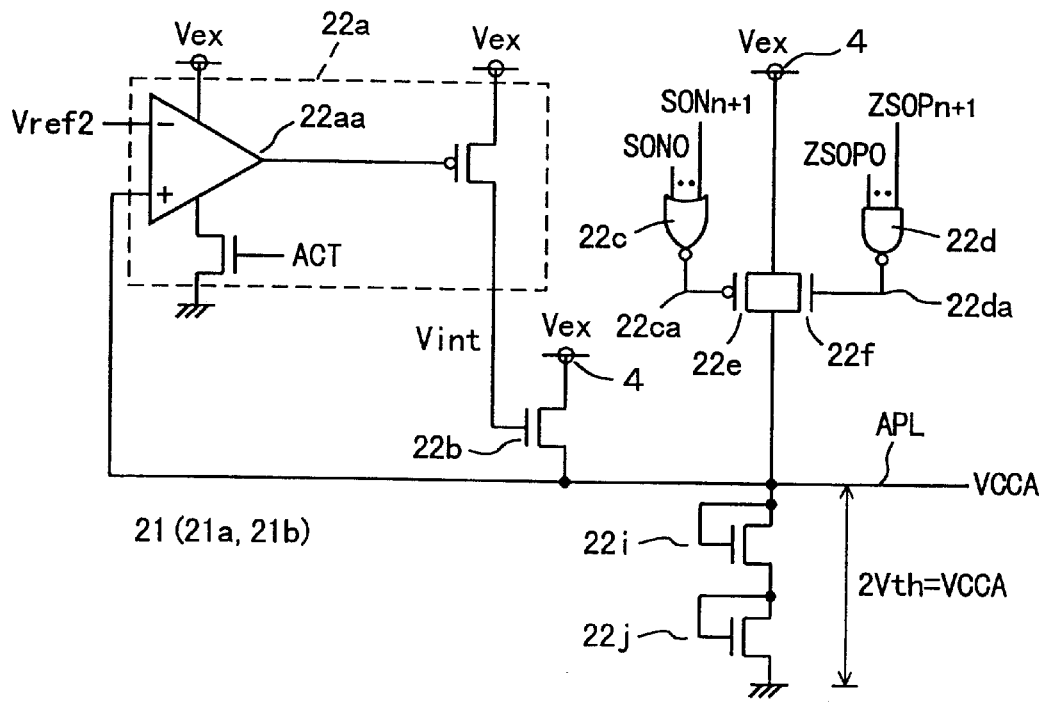
FIG. 17 is a diagram schematically showing a configuration of a sense amplifier power supply circuit according to a fifth embodiment of the present invention.

FIG. 17 is a diagram showing a configuration of an active sense amplifier power supply circuit 21 (21a and 21b) according to a fifth embodiment of the present invention. Arrangement of the array power supply line and sense amplifier power supply lines of a semiconductor memory device according to the fifth embodiment is the same as in the fourth embodiment shown in FIG. 13 and locations of the active sense amplifier power supply circuits and a standby sense amplifier power supply circuit in the configuration are the same as in the fourth embodiment.

In the active sense amplifier power supply circuit 21 shown in FIG. 17, no current drive MOS transistor 22g is provided and switching MOS transistors 22e and 22f are connected to the array power line APL. N channel MOS transistors 22i and 22j, both diode-connected, are connected in series between the array power line APL and a ground node. The other configuration is the same as that shown in FIG. 16 and corresponding components are denoted by the same reference numerals as those shown in FIG. 16.

The MOS transistors 22i and 22j each have a threshold voltage Vth. Therefore, when the array power supply voltage VCCA becomes higher than 2·Vth, the MOS transistors 22i and 22j become conductive, to reduce a voltage level of the array power supply voltage VCCA. An upper level of the array power supply voltage VCCA on the array power line APL is clamped to a level of 2·Vth. If the threshold voltage Vth of the MOS transistors 22i and 22j is set to 1 V, the array power supply voltage VCCA assumes 2 V.

In the configuration shown in FIG. 17, when one of the sense amplifier activation signals SOL0 to SOLn+1 and ZSOP0 to ZSOPn+1 is activated, then output signals of the NOR circuit 22c and the NAND circuit 22d go to L level and H level, respectively, and the MOS transistors 22e and 22f become conductive. At this time, the external power supply node 4 is connected to the array power line APL and a current is supplied to the array power line APL from the external power supply node 4 according to the current drive capabilities of the switching MOS transistors 22e and 22f. When a voltage level of the array power supply voltage VCCA rises beyond a voltage level equal to the sum of the threshold voltages of the MOS transistors 22i and 22j, the voltage level is reduced by the clamping MOS transistors 22i and 22j. Therefore, in a sensing operation in this case as well, a current drive capability of the active sense amplifier power supply circuit 21 is increased sufficiently, thereby enabling reduction in the array power supply voltage VCCA to be suppressed. Therefore, a delay due to interconnection line resistance can be compensated for with increase in supply of a current and reduction in voltage level of a sense amplifier power supply voltage in a sense amplifier band located at a remote position can be suppressed with the driving level according to a level of the reduction.

Modification 1

Figure 18:
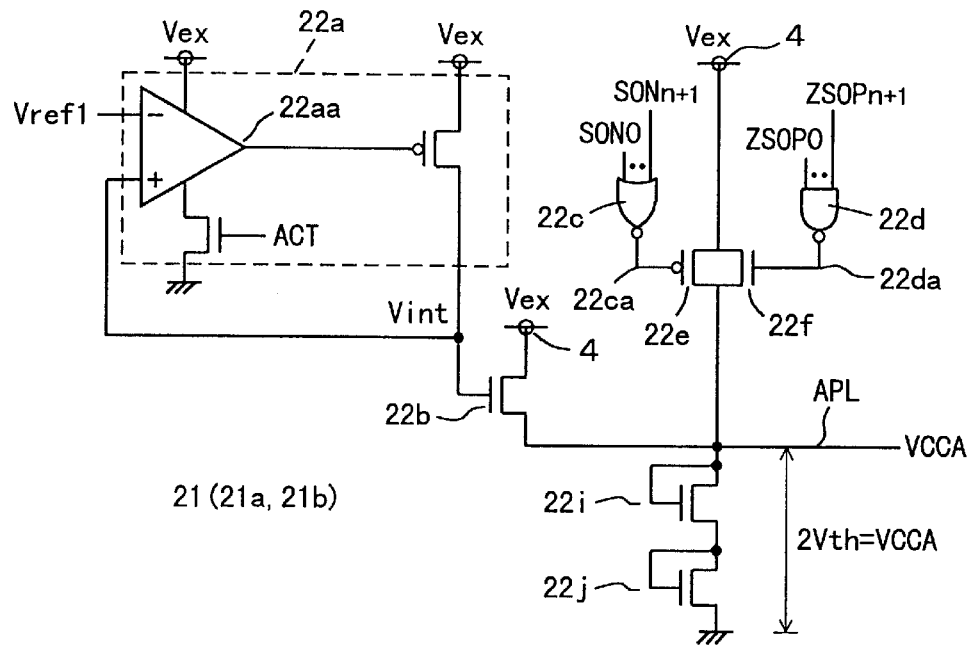
FIG. 18 is a circuit diagram showing a configuration of modification 1 of the fifth embodiment of the present invention.

FIG. 18 is a circuit diagram showing a configuration of modification 1 of the fifth embodiment of the present invention. In the configuration shown in FIG. 18, a comparator 22aa of a control voltage generation circuit 22a compares the reference voltage Vref1 and the control voltage Vint with each other. The other configuration is the same as that shown in FIG. 17. In the configuration shown in FIG. 18 as well, a current drive capability of an active sense amplifier power supply circuit is made larger in a sensing operation and, similar to the configuration in FIG. 17, reduction in level of a sense amplifier power supply voltage can be suppressed.

Modification 2

Figure 19:
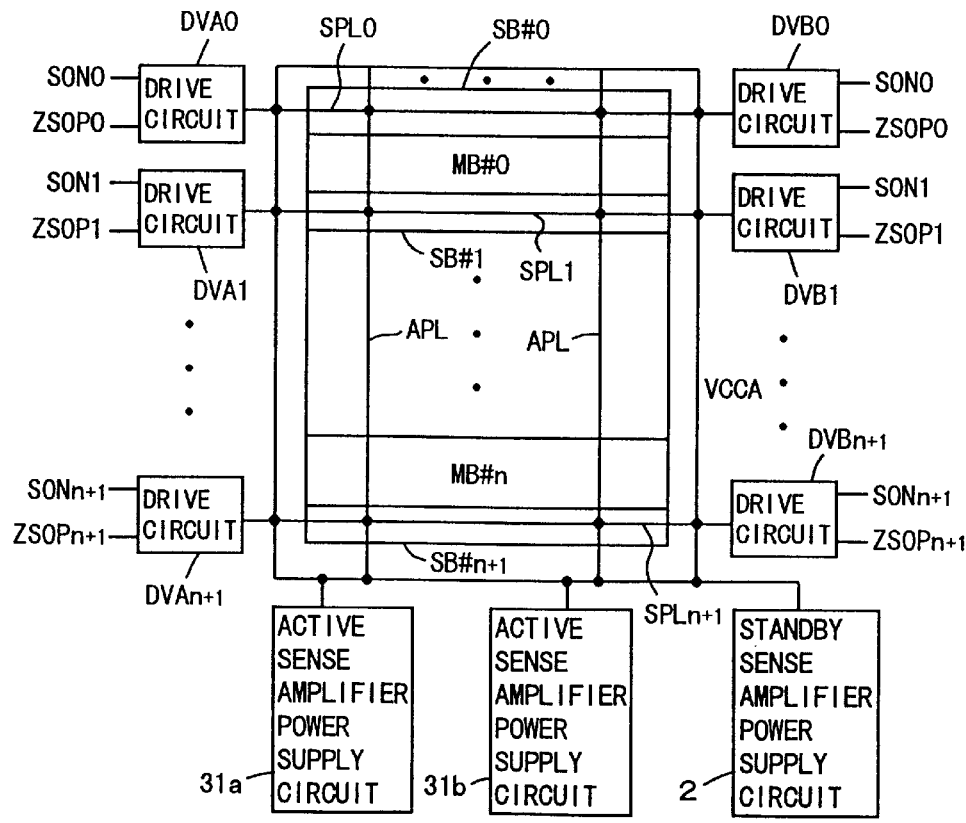
FIG. 19 is a block diagram schematically showing a configuration of a main part of a semiconductor memory device according to modification 2 of the fifth embodiment of the present invention.

FIG. 19 is a block diagram schematically showing a configuration of modification 2 of the fifth embodiment of the present invention. In FIG. 19, drive circuits DVA0 to DVAn+1 and DVB0 to DVMn+1 are provided corresponding to sense amplifier bands SB#0 to SB#n+1, respectively. Drive circuits DVAi and DVBi are disposed opposingly at both ends, respectively, of a corresponding sense amplifier power supply line SPLi. A standby sense amplifier power supply circuit 2 and active sense amplifier power supply circuits 31a and 31b are connected to the array power line APL. The active sense amplifier power supply circuits 31a and 31b have fixed current drive capabilities and supply currents onto the array power supply lines SPL when the array activation instruction signal ACT is active, thereby suppressing reduction in voltage level of the array power supply voltage VCCA.

The drive circuits DVA0 to DVAn+1 and DVB0 to DVBn+1 are activated when sense amplifiers of corresponding sense amplifier bands are made active and supply currents from an external power supply node to sense amplifier power supply lines SPL0 to SPLn+1 disposed in the corresponding sense amplifier bands. The drive circuits DVA0 and DVB0 to DVAn+1 and DVBn+1 are activated in response to the respective sense amplifier activation signals SON0 and ZSON0 to SONn+1 and ZSONn+1. The drive circuits DVA0 to DVAn+1 and DVB0 to DVBn+1 include respective clamping elements and clamp voltage levels of corresponding sense amplifier source lines at a voltage level of 2·Vth. Alternately, corresponding sense amplifier power supply lines are driven according to control voltages from the sense amplifier power supply circuits 31a and 31b.

Figure 20:
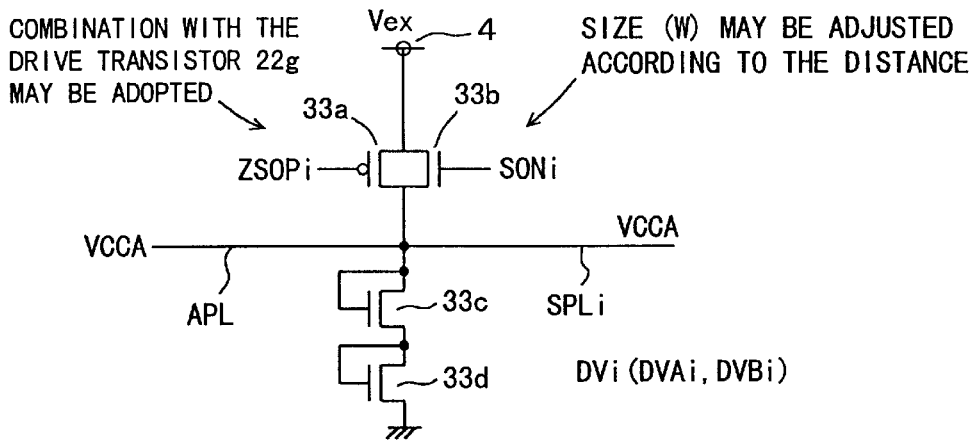
FIG. 20 is a diagram showing a configuration of a drive circuit shown in FIG. 19.

FIG. 20 is a diagram showing an example of a configuration of the drive circuits DVA0 to DVAn+1 and DVB0 to DVBn+1 shown in FIG. 19. Since the drive circuits DVA0 to DVAn+1 and DVB0 to DVBn+1 have the same configuration one another, one drive circuit DVi is shown in FIG. 20.

In FIG. 20, the drive circuit DVi includes: a P channel MOS transistor 33a which becomes conductive when a sense amplifier activation signal ZSOPi is active, to connect the external power supply node 4 and the sense amplifier power supply line SPL with each other therethrough; a P channel MOS transistor 33b which becomes conductive when a sense amplifier activation signal SONi is active, to connect the external power supply node 4 and a sense amplifier power supply line SPL with each other therethrough; and N channel MOS transistors 33c and 33d, both diode-connected, are connected in series between the sense amplifier power supply line SPL and a ground node.

A sense amplifier power supply line SPLi is further connected to the array power line APL and supplied with a current from a standby sense amplifier power supply circuit 2 in a standby cycle. Further, in an active cycle, a current is supplied from the active sense amplifier power supply circuits 31a and 31b. When a sense amplifier circuit of a corresponding sense amplifier band operates, the MOS transistors 33a and 33b become conductive in the drive circuit DVi, the external power supply node 4 is connected to the sense amplifier power supply line SPL and a current is supplied to the sense amplifier power supply line SPL from the external power supply node 4 according to the current drive capabilities of the MOS transistors 33a and 33b. Therefore, since a current is supplied to the sense amplifier power supply line SPLi from the external power supply node 4 in the vicinity of the sense amplifier power supply line SPLi, interconnection line resistance of the current supply path is small, and a current is supplied to the sense amplifier power supply line SPLi at a high speed, thereby enabling reduction in the array power supply voltage (sense power supply voltage) VCAA on the sense amplifier power supply line SPLi to be suppressed. The sense amplifier power supply line SPLi is held at a voltage level equal to the maximum 2·Vth by the clamping MOS transistors 33c and 33d. As the drive circuits DVA0 to DVAn+1 and DVB0 to DVBn+1, a drive transistor 22g shown in FIGS. 14 and 16 may be used.

In the case of FIGS. 19 and 20, a current is supplied from both ends of a sense amplifier power supply line by drive circuits in the vicinity of the sense amplifier power line, reduction in the sense amplifier power supply voltage can be compensated for at a high speed to restore it to its original level and thereby, the sense amplifier power supply voltage in each sense amplifier band can be maintained at a predetermined voltage level in a stable manner independently of a distance from the array power supply circuits 31a and 31b.

It should be noted that, in FIGS. 16 to 18, the active sense amplifier power supply circuits 31a and 31b includes: the control voltage generation circuit 22a: and the current drive MOS transistor 22b generating the array power supply voltage VCCA according to the control voltage Vint from the control voltage generation circuit 22a.

Further, in the configuration shown in FIG. 20, as in the third embodiment, sizes (channel widths) of the switching MOS transistors 33a and 33b may also be adjusted according to a distance from the active sense amplifier power supply circuits 31a and 31b. That is, current drive capabilities (channel widths) of the switching MOS transistors 33a and 33b of the drive circuits DVA0 and DVB0 provided for the sense amplifier band SB#0 are set to the largest, while current drive capabilities of the switch MOS transistors 33a and 33b of the drive circuits DVAn+1 and DVBn+1 provided for the sense amplifier band SB#n+1 closest to the active sense amplifier power supply circuits 31a and 31b are set to the smallest. Even in this case, current drive capabilities of the drive circuits each are adjusted according to a reduction in sense amplifier power supply voltage in the corresponding sense amplifier band and thereby, the reductions in sense amplifier power supply voltage in the respective sense amplifier bands can be suppressed to restore the sense amplifier power supply voltages to the original voltage level in a stable manner with almost the same characteristic.

As described above, according to the fifth embodiment of the present invention, an operating current of a sense amplifier circuit of a sense amplifier band is supplied to the array power line/a corresponding sense amplifier power supply line from the external power supply node, thereby the current is supplied at a high speed when the sense amplifier power supply voltage lowers to suppress reduction in the voltage level.

SIXTH EMBODIMENT

Figure 21:
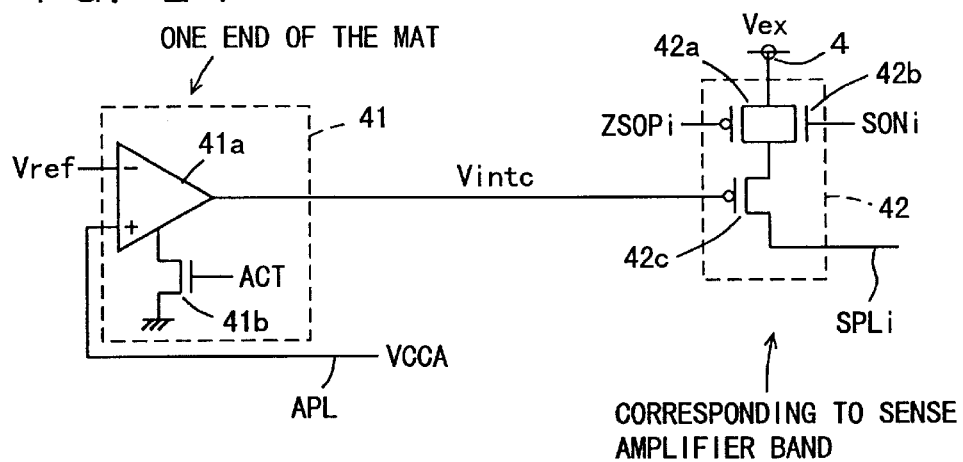
FIG. 21 is a circuit diagram showing a configuration of a main part of a semiconductor memory device according to a sixth embodiment of the present invention.

FIG. 21 is a circuit diagram showing a configuration of a main part of a semiconductor memory device according to a sixth embodiment of the present invention. A power supply source configuration in the sixth embodiment is equivalent to the configuration shown in FIG. 1. At one end of a memory mat, there is disposed an array power supply control circuit 41 generating the control voltage Vintc according to a difference between an array power supply voltage VCCA on the array power line APL and the reference voltage Vref. The array power supply control circuit 41 includes: a comparator 41a for comparing the array power supply voltage VCCA and the reference voltage Vref with each other when activated; and an activation transistor 41b activating the comparator 41a according to the array activation instruction signal ACT.

The control voltage Vintc from the active sense amplifier power supply control circuit 41 is supplied to a drive circuit 42 provided for each sense amplifier band. In FIG. 21, there is shown, as a representative, the power supply drive circuit 42 driving the sense amplifier power supply line SPLi provided in the sense amplifier band SB#i.

The power supply drive circuit 42 includes: a P channel MOS transistor 42a connected to an external power supply node 4, and made conductive when the sense amplifier activation signal ZSOPi is active; an N channel MOS transistor 42b connected to the external power supply node 4 and made conductive when the sense amplifier activation signal SONi is active; and a current drive P channel MOS transistor 42c connected between the MOS transistors 42a and 42b, and the sense amplifier power supply line SOPi, and receiving the control voltage Vintc at its gate.

When the array power supply voltage VCCA is higher than the reference voltage Vref, the control voltage Vintc goes to H level to turn the MOS transistor 42c into the off state. On the other hand, when the array power supply voltage VCCA is lower than the reference voltage Vref, the control voltage Vintc is driven to a low level according to a difference therebetween. In this situation, conductance of the P channel MOS transistor 42c increases and a current is supplied to the sense amplifier power supply line SPLi from the external power supply node 4 through the MOS transistors 42a and 42b. Thereby, reduction in voltage on the sense amplifier power supply line SPLi is suppressed.

In a case of the configuration shown in FIG. 21, there arises a necessity that the comparator 41a of the sense amplifier power supply control circuit 41 transmits the control voltage Vintc over a long distance and therefore, a size of the circuit 41 is made comparatively larger. The comparator 41a compares the voltage VCCA on the array power line APL and the reference voltage Vref. Therefore, even when reduction in voltage level on a sense amplifier power supply line SPLi is different according to positions of the sense amplifier bands, a current is supplied from a power supply drive circuit 42 in the vicinity thereof and thereby a delay of response is decreased and reduction in a sense amplifier power supply voltage on the sense amplifier power supply line SPLi can be suppressed at a high speed.

It should be noted that in the configuration shown in FIG. 21, a size (a channel width) of the current drive MOS transistor 42c may be adjusted according to a distance from the sense amplifier power supply control circuit 41(as the transistor is disposed farther, a current drive capability is made larger).

Modification

Figure 22:
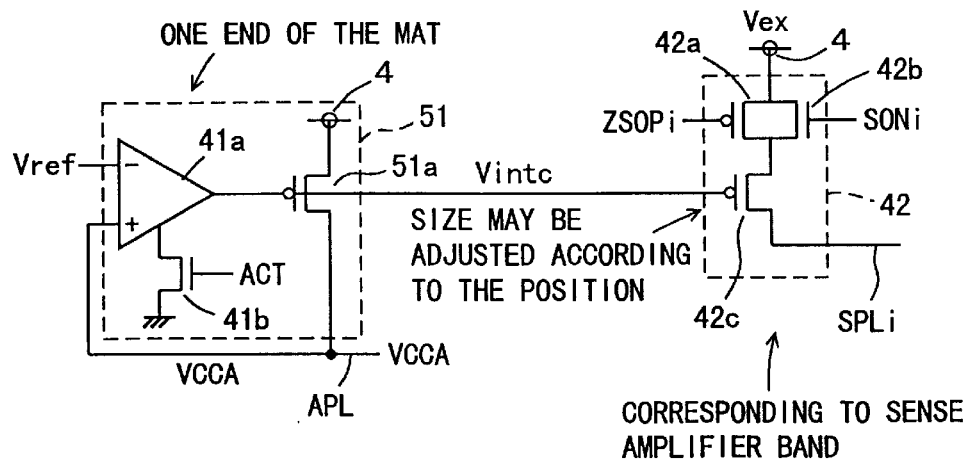
FIG. 22 is a circuit diagram schematically showing a configuration of a modification of the sixth embodiment of the present invention.
Figure 23:
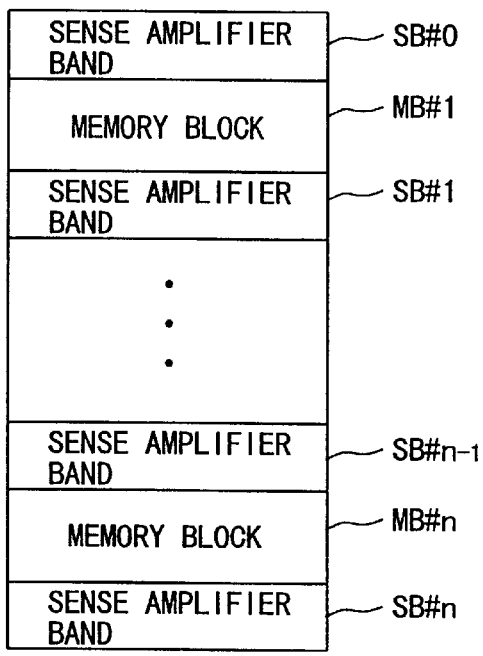
FIG. 23 is a diagram schematically showing a construction of a memory mat of a conventional semiconductor memory device.
Figure 24:
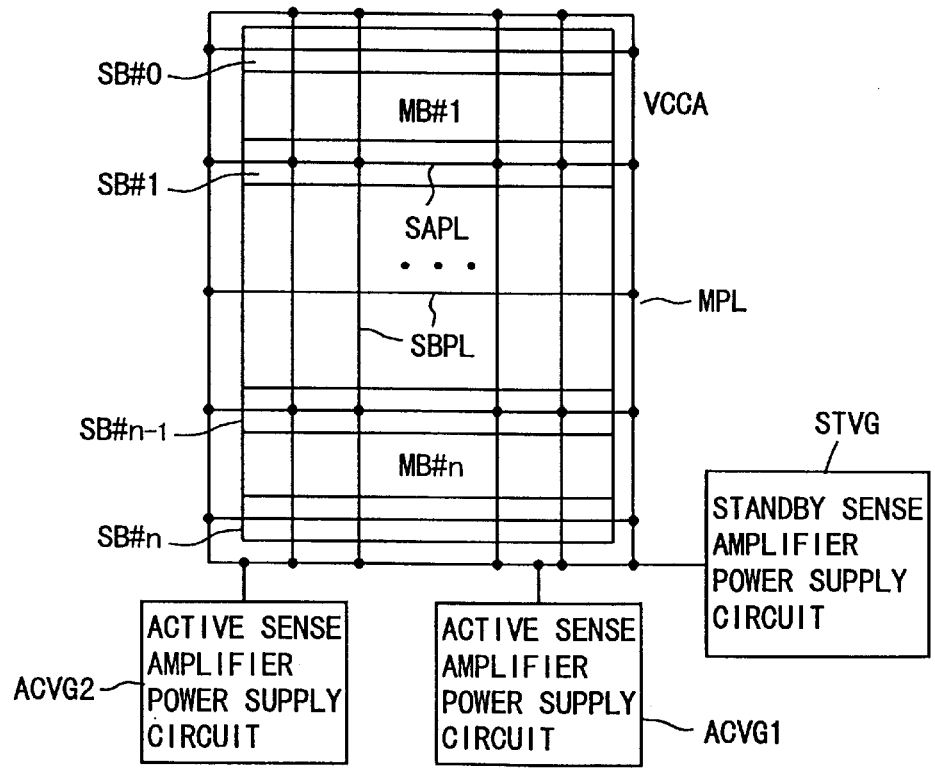
FIG. 24 is a block diagram schematically showing a configuration of a main part of a conventional semiconductor memory device.
Figure 25:
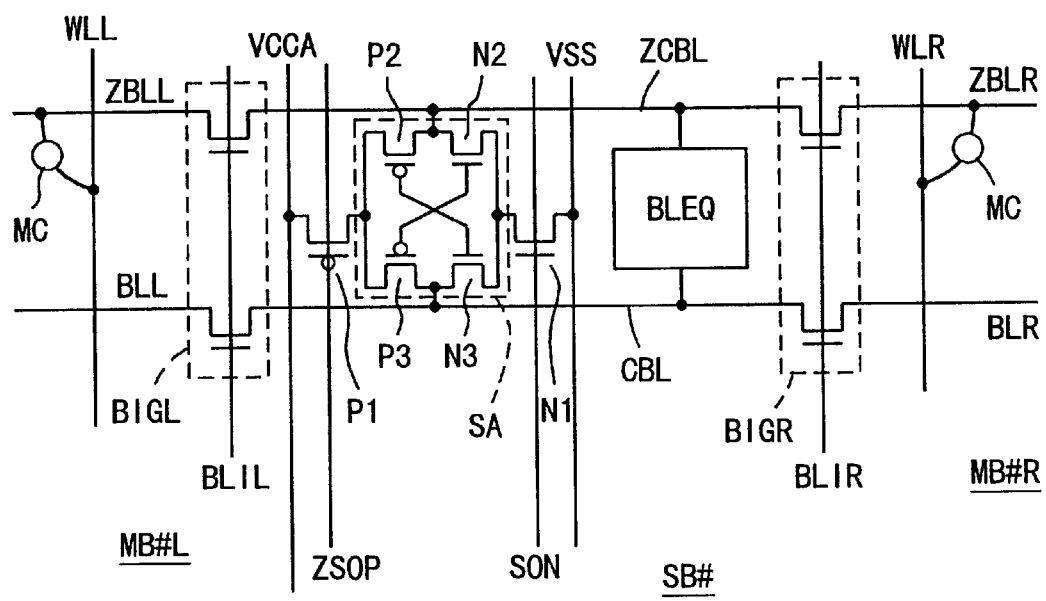
FIG. 25 is a circuit diagram schematically showing a configuration of a sense amplifier band in a conventional semiconductor memory device.
Figure 26:
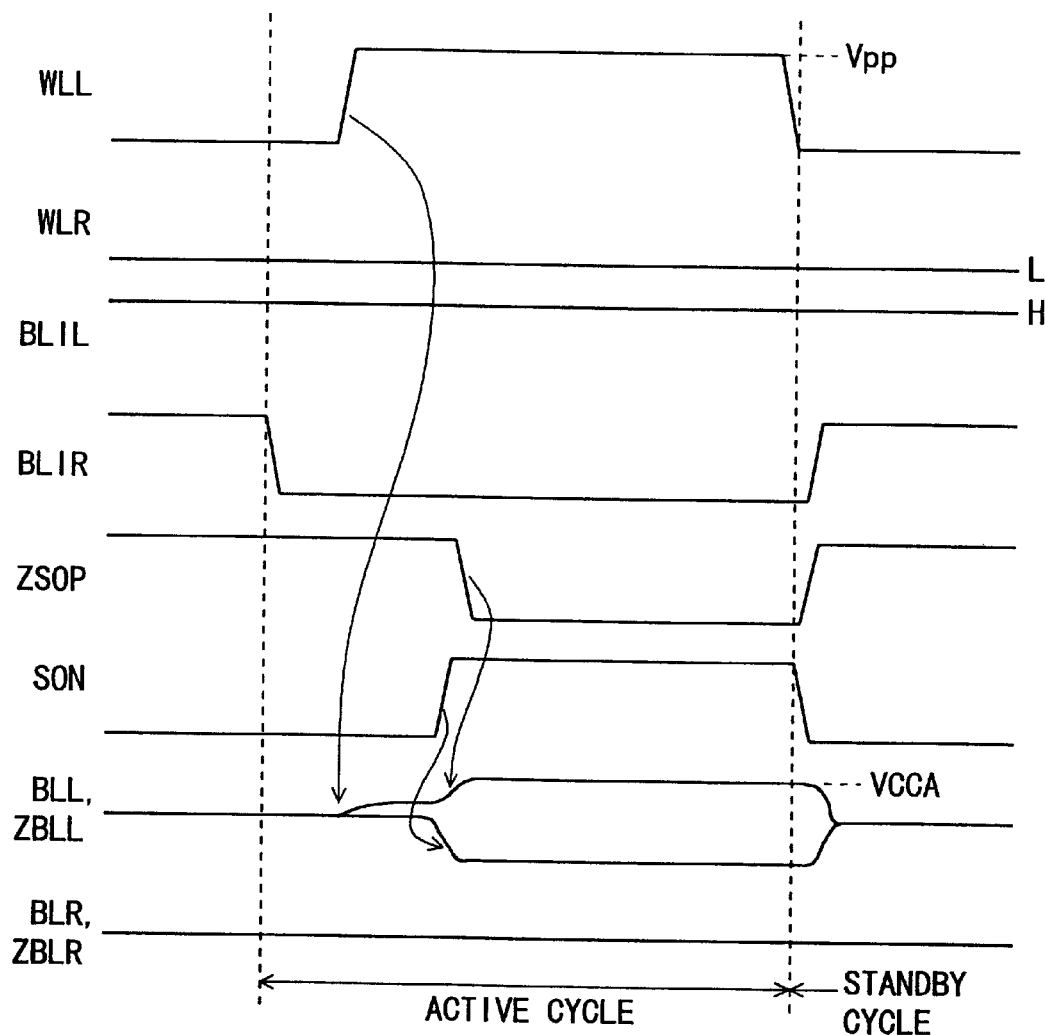
FIG. 26 is a signal waveform diagram representing operations of the circuitry shown in FIG. 25.
Figure 27:
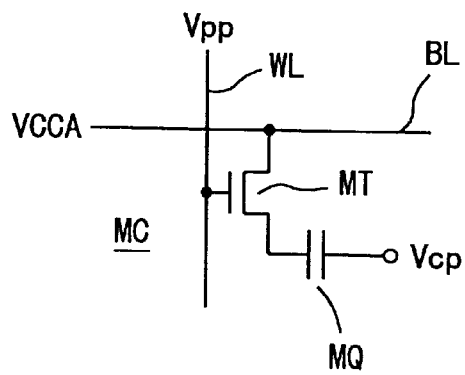
FIG. 27 is a circuit diagram showing a construction of a memory cell of a conventional semiconductor memory device.

FIG. 22 is a circuit diagram schematically showing a configuration of a modification of the sixth embodiment of the present invention. In FIG. 22, an active sense amplifier power supply/control circuit 51 is provided at one end of a memory mat. The modification of the sixth embodiment has the same configuration as that of the power supply related circuit of the second embodiment shown in FIG. 9. The active sense amplifier power supply/control circuit 51 includes: a comparator 41a for comparing the array power supply voltage VCCA on the array power line APL and the reference voltage Vref with each other when activated; an activation transistor 41b for activating the comparator 41a in response to the array activation instruction signal ACT; and a current drive P channel MOS transistor 51a for supplying a current from the external power supply node 4 to the array power line APL according to the control voltage Vintc from the comparator 41a.

A power supply driver 42 provided corresponding to each sense amplifier band has the same configuration as that shown in FIG. 21. In the configuration shown in FIG. 22, the active sense amplifier power supply/control circuit 51 is activated in an active cycle and supplies a current to the array power line APL in the cycle, thereby suppressing reduction in level of the array power supply voltage VCCA. Further, a power supply driver 42 provided corresponding to each sense amplifier band operates in operation of a sense amplifier circuit in a corresponding sense amplifier band and supplies a current from the external power supply node 4 to a corresponding sense amplifier power supply line SPLi according to the control voltage Vintc. Therefore, the current is supplied to the sense amplifier power supply line SPLi from the external power supply node in the vicinity of the sense amplifier source line SPLi, thereby enabling reduction in level of the sense amplifier power supply voltage on the sense amplifier power supply line SPLi to be suppressed.

It should be noted that, in the configuration shown in FIG. 22, a size (a channel width W) of the MOS transistor 42 of the power supply driver 42 may also be made larger with increase in distance from the active sense amplifier power supply/control circuit 51. That is, a size (a channel width W) of the MOS transistor 42c of the power supply driver 42 provided for the sense amplifier band farthest from the active sense amplifier power supply/control circuit 51 may be made the largest. An effect similar to that of the third embodiment can be attained.

As described above, according to the sixth embodiment of the present invention, a current is supplied to a sense amplifier power supply line from a power supply driver provided in the vicinity of a corresponding sense amplifier band according to the control voltage output from the comparator by the P channel MOS transistor and therefore, reduction in level of the sense amplifier power supply voltage can be suppressed in a stable manner, independently of a distance from the array power supply voltage generation circuits.

Other embodiments

It should be noted that a semiconductor memory device is only required to be of a dynamic random access memory type and may also be of a synchronous type operating synchronization with a clock signal.

As described above, according to the present invention, since a configuration is adopted in which a power supply driver is provided in the vicinity of a sense amplifier band or a current drive capability of an array power supply voltage generation circuit is made larger in a sensing operation, therefore reduction in level of the sense amplifier power supply voltage can be suppressed in each sense amplifier band, independently of a distance from the array power supply voltage generation circuit, thereby enabling a voltage level of a H level data on each memory cell to be raised, with the result of improvement on sensing margin and a refresh characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory array including a plurality of memory blocks each having a plurality of memory cells arranged in rows and columns, said plurality of memory blocks being arranged aligned along a column direction;
a plurality of sense amplifier bands placed corresponding to the memory blocks along said column direction, each sense amplifier band including sense amplifier circuits for sensing and amplifying data of selected memory cells of a corresponding memory block when activated;
a power line laid extending over said plurality of memory blocks and said plurality of sense amplifier bands, said power line including sense amplifier power supply lines each for supplying a power supply voltage to sense amplifier circuits of a respective sense amplifier band and said sense amplifier power supply lines provided corresponding to the sense amplifier bands and extending along a row direction in corresponding sense amplifier bands and connected to one another;
a sense amplifier power supply voltage generation circuit for generating a control voltage; and
a plurality of drive circuits provided corresponding to the respective sense amplifier bands, each drive circuit being activated when sense amplifier circuits of a corresponding sense amplifier band are active, for supplying a current to a corresponding sense amplifier power supply line according to said control voltage.

2. The semiconductor memory device according to claim 1, wherein said sense amplifier power supply voltage generation circuit comprises first and second sense amplifier power supply control circuits made active in an active cycle in which a row select operation is carried out in said memory array, and
said plurality of drive circuit include drive circuits in a pair are provided at opposed ends of sense amplifier power supply line disposed corresponding to each of the sense amplifier bands, and the drive circuits of a pair comprise first and second sense amplifier source drive circuits receiving control voltages from said first and second sense amplifier power supply control circuits, respectively.

3. The semiconductor memory device according to claim 1, wherein said sense amplifier power supply voltage generation circuit is connected t o said power supply line and comprises a current drive element for supplying a current to said power supply line according to said control voltage.

4. The semiconductor memory device according to claim 1, wherein said sense amplifier power supply voltage generation circuit is disposed at one end of said memory array, and said plurality of drive circuits each comprise a sense amplifier power supply line drive element having a current drive capability increased as a distance thereto from said sense amplifier power supply voltage generation circuit increases.

5. The semiconductor memory device according to claim 2, wherein each of said first and second sense amplifier power supply control circuits is connected to said power supply line, and comprises a current drive element for supplying a current to said power supply line in response to a respective control voltage.

6. The semiconductor memory device according to claim 1, wherein said sense amplifier power supply voltage generation circuit comprises a comparator activated when a row select operation is carried out in said memory array for comparing one of a voltage on said power supply line and said control voltage, and a reference voltage with each other, and a control voltage drive element for supplying a current from a power supply node to a control voltage transmission line according to an output signal of said comparator, to generate said control voltage.

7. A semiconductor memory device comprising:
a memory array having a plurality of memory cells arranged in rows and columns;
a sense amplifier power supply voltage generation circuit for generating an internal power supply voltage;
an internal power supply line for transmitting said internal power supply voltage generated by said sense amplifier power supply voltage generation circuit;

a plurality of sense amplifier circuits each operating using said internal power supply voltage on said internal power supply line as an operating power supply voltage when activated and each carrying out sensing and amplification of a data of a memory cell on a selected row of said memory array; and a drive circuit for supplying a current to said internal power supply line when at least one sense amplifier circuit of said plurality of sense amplifier circuits is activated.

8. The semiconductor memory device according to claim 7, wherein said drive circuit comprises:

a switch circuit made conductive when the sense amplifier circuits are active, connecting a power supply node receiving an external power supply voltage and said internal power supply line with each other; and a clamp circuit for clamping a voltage of said internal power supply line to a predetermined voltage level.

9. The semiconductor memory device according to claim 7, wherein said sense amplifier power supply voltage generation circuit comprises:

a control voltage generation circuit for generating a control voltage; and a current drive element for supplying a current to said internal power supply line according to said control voltage, and said drive circuit comprises:

a switch circuit made conductive when the sense amplifier circuits are made active; and an auxiliary drive element connected in series to said switch circuit between a power supply node receiving an external power supply voltage and said internal power supply line, and supplying a current from said power supply node to said internal power supply line according to said control voltage.

10. The semiconductor memory device according to claim 7, wherein said memory array is divided into a plurality of memory blocks, and said plurality of sense amplifier circuits are arranged being dispersed in a plurality of sense amplifier bands disposed corresponding to the memory blocks, a power supply line transmitting said internal power supply voltage comprises sense amplifier power supply lines arranged corresponding to the sense amplifier bands each supplying the power supply voltage to sense amplifier circuits in a corresponding sense amplifier band, and wherein said drive circuit comprises a plurality of sense amplifier power supply drive circuits provided corresponding to the sense amplifier bands and each activated when sense amplifier circuit of a corresponding sense amplifier band is made active, to supply a current to sense amplifier power supply line in a corresponding sense amplifier band.

11. The semiconductor memory device according to claim 10, wherein said sense amplifier power supply voltage generation circuit comprises a circuit for supplying a current to said internal power supply line in response to activation of sense amplifier circuits of a sense amplifier band among the sense amplifier band.

12. The semiconductor memory device according to claim 1, wherein said sense amplifier power supply voltage generation circuit comprises a comparator for comparing a voltage on said power supply line and a reference voltage with each when activated to generate said control voltage according to a result of comparison.

13. The semiconductor memory device according to claim 1, wherein said control voltage is a constant voltage at a predetermined voltage level.

14. The semiconductor memory device according to claim 1, wherein each drive circuit supplies the current to the corresponding sense amplifier power supply line according to the control voltage when activated in response to a sense amplifier activation signal for activating the sense amplifier circuits in the corresponding sense amplifier band.

15. The semiconductor memory device according to claim 1, further comprising a standby sense power supply circuit for generating the power supply voltage onto the sense amplifier power supply lines.

16. The semiconductor memory device according to claim 7, wherein said sense amplifier power supply voltage generation circuit generates said sense amplifier power supply voltage onto said internal power supply line.

* * * * *